(12) United States Patent
Clark et al.

(10) Patent No.: US 8,995,204 B2
(45) Date of Patent: Mar. 31, 2015

(54) CIRCUIT DEVICES AND METHODS HAVING ADJUSTABLE TRANSISTOR BODY BIAS

(75) Inventors: Lawrence T. Clark, Phoenix, AZ (US); Bruce McWilliams, Atherton, CA (US); Robert Rogenmoser, Sunnyvale, CA (US)

(73) Assignee: Suvolta, Inc., Los Gatos, CA (US)

( * ) Notice: Subject to any disclaimer, the term of this patent is extended or adjusted under 35 U.S.C. 154(b) by 931 days.

(21) Appl. No.: 13/167,625

(22) Filed: Jun. 23, 2011

(65) Prior Publication Data

US 2012/0327725 A1    Dec. 27, 2012

(51) Int. Cl.
  *G11C 7/00*  (2006.01)
  *G11C 11/412*  (2006.01)
(52) U.S. Cl.
  CPC .................................. *G11C 11/412* (2013.01)
  USPC .......... 365/189.011; 365/189.09; 365/185.18; 365/191
(58) Field of Classification Search
  USPC .................. 365/189.011, 189.09, 185.18, 191
  See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |

(Continued)

FOREIGN PATENT DOCUMENTS

EP    0274278 A1    7/1988
EP    0312237 A2    4/1989

(Continued)

OTHER PUBLICATIONS

English Abstract of JP2004087671 submitted herewith, Mar. 18, 2004.

(Continued)

*Primary Examiner* — Pho M Luu

(57) ABSTRACT

Circuits, integrated circuits devices, and methods are disclosed that may include biasable transistors with screening regions positioned below a gate and separated from the gate by a semiconductor layer. Bias voltages can be applied to such screening regions to optimize multiple performance features, such as speed and current leakage. Particular embodiments can include biased sections coupled between a high power supply voltage and a low power supply voltage, each having biasable transistors. One or more generation circuits can generate multiple bias voltages. A bias control section can couple one of the different bias voltages to screening regions of biasable transistors to provide a minimum speed and lowest current leakage for such a minimum speed.

29 Claims, 16 Drawing Sheets

(56) References Cited

U.S. PATENT DOCUMENTS

| | | |
|---|---|---|
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasamura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirarta |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B2 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |

(56) References Cited

U.S. PATENT DOCUMENTS

| | | |
|---|---|---|
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,113,430 B2 * | 9/2006 | Hoefler et al. ............ 365/185.23 |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,149,142 B1 * | 12/2006 | Fisher et al. .................. 365/229 |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,382,674 B2 * | 6/2008 | Hirabayashi .................. 365/226 |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawae et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |

(56) References Cited

U.S. PATENT DOCUMENTS

| | | |
|---|---|---|
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,107,279 B2 * | 1/2012 | Yamaoka et al. ............. 365/154 |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,254,200 B2 * | 8/2012 | Eid et al. ............. 365/226 |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |

(56) References Cited

U.S. PATENT DOCUMENTS

| | | |
|---|---|---|
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

English Abstract of JP4186774 submitted herewith, Jul. 3, 1992.
English Abstract of JP59193066 submitted herewith, Nov. 1, 1984.
English Abstract of JP8153873 submitted herewith, Jun. 11, 1996.
English Abstract of JP8288508 submitted herewith, Nov. 1, 1996.
English Translation of JP8288508 submitted herewith, May 26, 2011.
Banerjee et al., "Compensating Non-Optical Effects using Electrically-Driven Optical Proximity Correction", Proc. of SPIE, vol. 7275, 2009.
Cheng et al., "Extremely Thin SOI (ETSOI) CMOS with Record Low Variability for Low Power System-on-Chip Applications", IEDM 2009, Dec. 2009.
Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.
Drennan et al., "Implications of Proximity Effects for Analog Design", Custom Integrated Circuits Conference, 2006, CICC '06, IEEE, Sep. 10-13, 2006, pp. 169-176.
Hook et al., "Lateral Ion Implant Straggle and Mask Proximity Effect", IEEE Transactions on Electron Devices, vol. 50, No. 9, Sep. 2003.
Hori et al., "A 0.1 um CMOS with a Step Channel Profile Formed by Ultra High Vacuum CVD and In-Situ Doped Ions", IEDM 1993, May 12, 1993.
Matsuhashi et al., "High-Performance Double-Layer Epitaxial-Channel PMOSFET Compatible with a Single Gate CMOSFET", 1996 Symposium on VLSI Technology Digest of Technical Papers, 1996.
Shao et al., "Boron diffusion in silicon: the anomalies and control by point defect engineering", Materials Science and Engineering R 42 (2003), Nov. 2003, pp. 65-114.
Sheu et al., "Modeling the Well-Edge Proximity Effect in Highly Scaled MOSFETs", IEEE Transactions on Electron Devices, vol. 53, No. 11, Nov. 2006, pp. 2792-2798.
string1 string2 string3.
Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.
Chau, R et al., "A 50nm Depleted-Substrate CMOS Transistor (DST)", Electron Device Meeting 2001, IEDM Technical Digest, IEEE International, 2001, pp. 29.1.1-29.1.4.
Ducroquet, F et al. "Fully Depleted Silicon-On-Insulator nMOSFETs with Tensile Strained High Carbon Content Si1-yCy Channel", 2006, ECS 210th Meeting, Abstract 1033.
Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.
Goesele, U et al., Diffusion Engineering by Carbon in Silicon, 2000, Mat. Res. Soc. Symp. vol. 610.
Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.
Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.
Holland, OW and Thomas, DK "A Method to Improve Activation of Implanted Dopants in SiC", 2001, Oak Ridge National Laboratory, Oak Ridge, TN.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.
Lavéant, P. "Incorporation, Diffusion and Agglomeration of Carbon in Silicon", 2002, Solid State Phenomena, vols. 82-84, pp. 189-194.
Noda, K et al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809 -814.
Ohguro, T et al., "An 0.18-μm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.
Pinacho, R et al., "Carbon in Silicon: Modeling of Diffusion and Clustering Mechanisms", Aug. 2002, Journal of Applied Physics, vol. 92, No. 3, pp. 1582-1588.
Robertson, LS et al., "The Effect of Impurities on Diffusion and Activation of Ion Implanted Boron in Silicon", 2000, Mat. Res. Soc. Symp. vol. 610.
Scholz, R et al., "Carbon-Induced Undersaturation of Silicon Self-Interstitials", Jan. 1998, Appl. Phys. Lett. 72(2), pp. 200-202.
Scholz, RF et al., "The Contribution of Vacancies to Carbon Out-Diffusion in Silicon", Jan. 1999,Appl. Phys. Lett., vol. 74, No. 3, pp. 392-394.
Stolk, PA et al., "Physical Mechanisms of Transient Enhanced Dopant Diffusion in Ion-Implanted Silicon", May 1997, J. Appl. Phys. 81(9), pp. 6031-6050.
Thompson, S et al., "MOS Scaling: Transistor Challenges for the 21st Century", 1998, Intel Technology Journal Q3' 1998, pp. 1-19.
Wann, C. et al., "Channel Profile Optimization and Device Design for Low-Power High-Performance Dynamic-Threshold MOSFET", 1996, IEDM 96, pp. 113-116.
Werner, P. et al., "Carbon Diffusion in Silicon", Oct. 1998, Applied Physics Letters, vol. 73, No. 17, pp. 2465-2467.
Yan, Ran-Hong et al., "Scaling the Si MOSFET: From Bulk to SOI to Bulk", Jul. 1992, IEEE Transactions on Electron Devices, vol. 39, No. 7.
Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, Jan. 1999.
Wong, H et al., "Nanoscale CMOS", Proceedings of the IEEE, vol. 87, No. 4, pp. 537-570, Apr. 1999.
Machine Translation of KR 10-0794094 Submitted herewith, Dec. 28, 2001.

* cited by examiner

| | | \|← 859 |
|---|---|---|
| | pmos VBBR | |

| | | 0 | 0.1 | 0.2 | 0.3 | 0.4 | 0.5 |
|---|---|---|---|---|---|---|---|
| nmos VBBR | 0 | 2859 | 2394 | 1929 | 1475 | 1026 | 582 |
| | 0.1 | 2431 | 1983 | 1533 | 1092 | 657 | 230 |
| | 0.2 | 2000 | 1569 | 1140 | 714 | 297 | -115 |
| | 0.3 | 1568 | 1159 | 748 | 342 | -58 | -452 |
| | 0.4 | 1138 | 748 | 359 | -27 | -408 | -787 |
| | 0.5 | 699 | 335 | -32 | -396 | -759 | -1116 |

COUNTS

FIG. 8A

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.36 | -0.56 | -0.66 | -0.72 | -0.76 |
| | 0.1 | -0.10 | -0.46 | -0.65 | -0.76 | -0.82 | -0.85 |
| | 0.2 | -0.15 | -0.51 | -0.70 | -0.81 | -0.87 | -0.90 |
| | 0.3 | -0.17 | -0.53 | -0.73 | -0.84 | -0.90 | -0.93 |
| | 0.4 | -0.19 | -0.55 | -0.74 | -0.85 | -0.91 | -0.94 |
| | 0.5 | -0.19 | -0.55 | -0.75 | -0.86 | -0.92 | -0.95 |

I LEAK AVE. (Nominal)

FIG. 8B

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.15 | -0.22 | -0.27 | -0.29 | -0.30 |
| | 0.1 | -0.32 | -0.47 | -0.54 | -0.59 | -0.61 | -0.62 |
| | 0.2 | -0.49 | -0.64 | -0.71 | -0.76 | -0.78 | -0.79 |
| | 0.3 | -0.58 | -0.73 | -0.80 | -0.85 | -0.87 | -0.88 |
| | 0.4 | -0.63 | -0.77 | -0.85 | -0.89 | -0.92 | -0.93 |
| | 0.5 | -0.65 | -0.80 | -0.88 | -0.92 | -0.94 | -0.95 |

I LEAK AVE. (skewed silicon - slow pmos, fast nmos)

FIG. 8C

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.32 | -0.45 | -0.55 | -0.63 | -0.71 |
| | 0.1 | -0.32 | -0.63 | -0.76 | -0.86 | -0.95 | -1.02 |
| | 0.2 | -0.45 | -0.76 | -0.89 | -1.00 | -1.08 | -1.15 |
| | 0.3 | -0.55 | -0.86 | -1.00 | -1.10 | -1.18 | -1.26 |
| | 0.4 | -0.63 | -0.95 | -1.08 | -1.18 | -1.27 | -1.34 |
| | 0.5 | -0.71 | -1.02 | -1.15 | -1.26 | -1.34 | -1.41 |

I LEAK WEIGHTING (typical skew)

FIG. 8D

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.40 | -0.64 | -0.78 | -0.86 | -0.91 |
| | 0.1 | 0 | -0.42 | -0.66 | -0.80 | -0.88 | -0.92 |
| | 0.2 | -.01 | -0.42 | -0.67 | -0.81 | -0.89 | -0.93 |
| | 0.3 | -.01 | -0.43 | -0.67 | -0.81 | -0.89 | -0.94 |
| | 0.4 | -.01 | -0.43 | -0.67 | -0.81 | -0.89 | -0.94 |
| | 0.5 | -.01 | -0.43 | -0.67 | -0.81 | -0.89 | -0.94 |

I LEAK AVE. (skewed silicon - slow nmos, fast pmos)

FIG. 8E

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.37 | -0.53 | -0.65 | -0.75 | -0.83 |
| | 0.1 | -0.25 | -0.62 | -0.77 | -0.89 | -0.99 | -1.08 |
| | 0.2 | -0.35 | -0.72 | -0.87 | -0.99 | -1.10 | -1.18 |
| | 0.3 | -0.42 | -0.80 | -0.95 | -1.07 | -1.17 | -1.26 |
| | 0.4 | -0.49 | -0.86 | -1.02 | -1.14 | -1.24 | -1.32 |
| | 0.5 | -0.55 | -0.92 | -1.08 | -1.20 | -1.30 | -1.38 |

IDEAL I LEAK WEIGHTING (slow pmos, fast nmos)

FIG. 8F

| | | pmos VBBR | | | | | |
|---|---|---|---|---|---|---|---|
| | | 0 | 0.1 | 0.2 | 0.3 | 0.4 | 0.5 |
| nmos VBBR | 0 | 0 | -0.25 | -0.35 | -0.42 | -0.49 | -0.55 |
| | 0.1 | -0.37 | -0.62 | -0.72 | -0.80 | -0.86 | -0.92 |
| | 0.2 | -0.53 | -0.77 | -0.88 | -0.95 | -1.02 | -1.07 |
| | 0.3 | -0.65 | -0.89 | -0.99 | -1.07 | -1.14 | -1.20 |
| | 0.4 | -0.75 | -0.99 | -1.10 | -1.17 | -1.24 | -1.30 |
| | 0.5 | -0.84 | -1.08 | -1.18 | -1.26 | -1.33 | -1.38 |

IDEAL I LEAK WEIGHTING (fast pmos, slow nmos)

FIG. 8G

| | pmos VBBR | | | | | |
|---|---|---|---|---|---|---|
| nmos VBBR | 0,0 | 1,0 | 2,0 | 3,0 | 4,0 | 5,0 |
| | 0,1 | 1,1 | 2,1 | 3,1 | 4,1 | 5,1 |
| | 0,2 | 1,2 | 2,2 | 3,2 | 4,2 | 5,2 |
| | 0,3 | 1,3 | 2,3 | 3,3 | 4,3 | 5,3 |
| | 0,4 | 1,4 | 2,4 | 3,4 | 4,4 | 5,4 |
| | 0,5 | 1,5 | 2,5 | 3,5 | 4,5 | 5,5 |

DATA POINTS

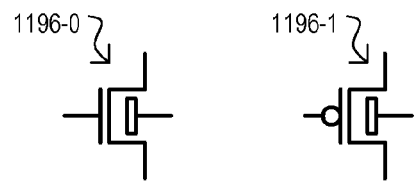
FIG. 11A
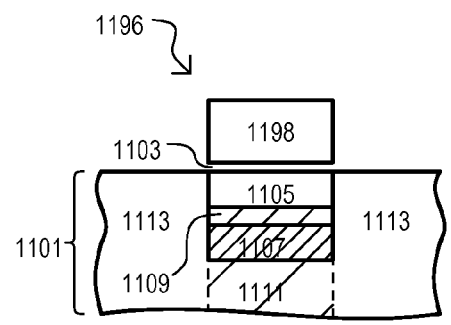
FIG. 11B
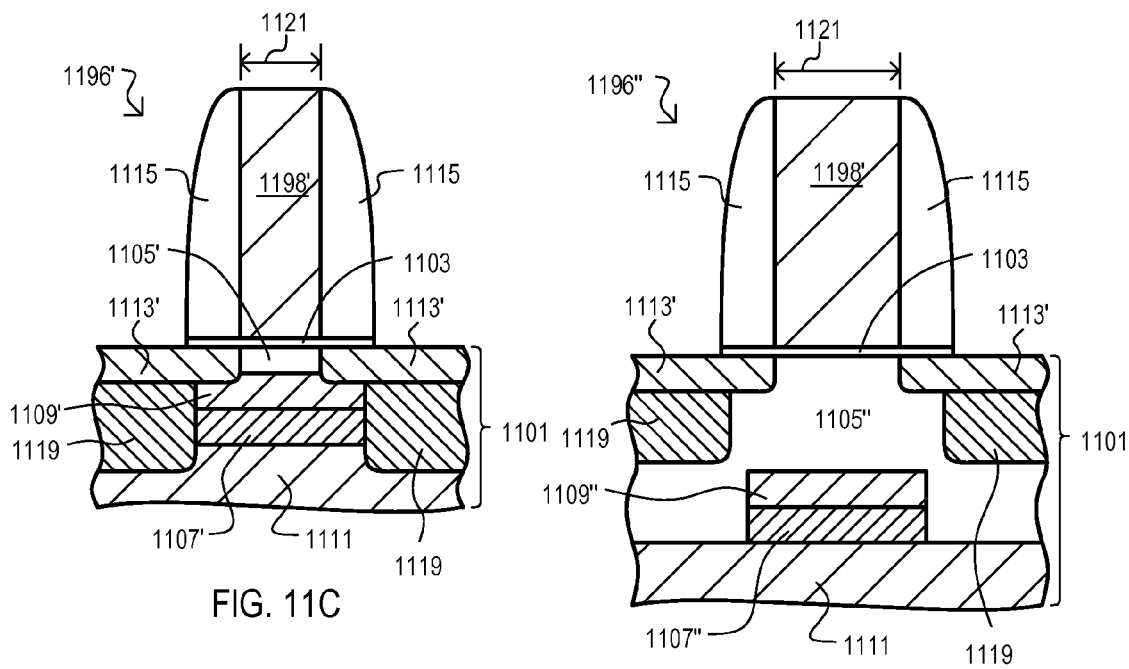
FIG. 11C
FIG. 11D

CIRCUIT DEVICES AND METHODS HAVING ADJUSTABLE TRANSISTOR BODY BIAS

TECHNICAL FIELD

The present invention relates generally to electronic circuits, and more particularly to circuits having transistors that can be dynamically or statically biased using a body bias voltage.

BACKGROUND

Integrated circuit (IC) devices (e.g., chips) are typically manufactured with thousands, millions, or even billions of transistors in a single device. Proper operation of such devices can often require precise timing and or performance between various circuit sections. Unfortunately, the operation of such transistors can be subject to uncontrollable variation arising from numerous sources. Variations can arise from the manufacturing process used to fabricate the device, variations in device materials, changes in operating temperature, variations in power supply voltages, or even the age of an IC device, to name but a few.

Conventionally, IC devices are designed to try to accommodate such variations, by including extra circuits and/or higher operating voltages. Such approaches can be conceptualized as "overdesigning" a chip; as such approaches could be avoided if transistors had less variation in performance. As device features continue to shrink in size and operate at lower voltages, conventional overdesign techniques may require undesirably large amounts of device area and/or circuit power to achieve a desired circuit performance.

All of the above can present formidable limits to achieving faster and more efficient IC devices with conventional transistors and design approaches.

BRIEF DESCRIPTION OF THE DRAWINGS

FIGS. 8A to 8G are tables showing body bias selection methods according to embodiments.

FIGS. 11A to 11D describe enhanced body effect (EBE) transistors that can be included in the embodiments.

DETAILED DESCRIPTION

Figure 1:
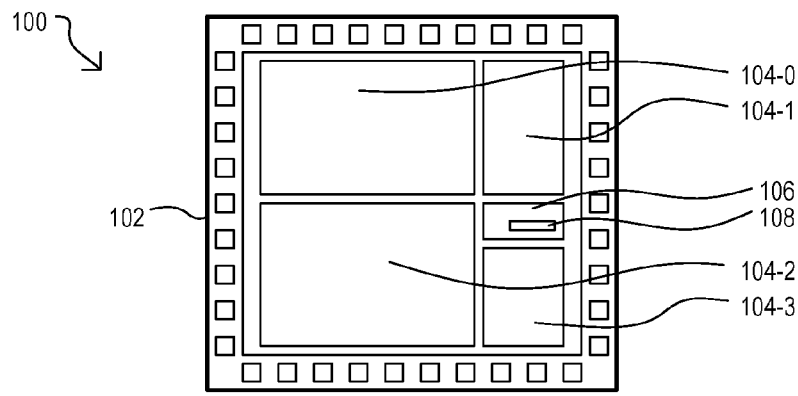
FIG. 1 shows an integrated circuit (IC) device according to an embodiment.

Various embodiments of the present invention will now be described in detail with reference to a number of drawings. The embodiments show circuits and related methods for biasing transistors in an integrated device to achieve a desired circuit performance despite variations in manufacturing and/or operating conditions. In particular embodiments, circuits may include enhanced body effect (EBE) transistors having an enhanced body coefficient as compared to conventional transistors, which can deliver highly effective application of body bias voltages. Alternate embodiments can include non-EBE transistors, or a mix of EBE and non-EBE transistors.

In the various embodiments below, like items are referred to by the same reference character but with the leading digits corresponding to the figure number.

Referring now to FIG. 1 an integrated circuit (IC) device according to one embodiment is shown in a top plan view, and designated by the general reference character 100. An IC device 100 may be formed as a "die" having substrate 102 containing the various circuits therein. An IC device 100 may include one or more biased circuit sections and one or more bias control sections. FIG. 1 identifies four biased circuit sections as 104-0 to 104-3 and a bias control section as 106. Any or all of biased circuit sections (104-0 to 104-3) can be formed of transistors having bodies that can be biased to a selectable body bias voltage. In very particular embodiments, such transistors can be EBE transistors having an enhanced body coefficient, which are biased by applying a selectable body bias voltage to a screening region of the EBE transistor, as described in more detail below.

A bias control section 106 can select which body bias voltage(s) are applied to the various biased circuit sections (104-0 to 104-3). A bias control section 106 can include one or more "emulation" circuits (one shown as 108) that can include circuit structures corresponding to biased circuit sections (104-0 to 104-3). Thus, application of various body bias voltages to such emulation circuits can reflect the effect of such body bias voltages on the biased circuit sections (104-0 to 104-3).

As will be described in conjunction with embodiments below, such a body bias voltage can be a "reverse" body bias voltage (VBBR) (e.g., the screening region reverse biased with respect to the source—of an EBE transistor) and/or a "forward" body bias voltage (VBBF) (e.g., the screening region forward biased with respect to the source of the EBE transistor).

Embodiments can have varying degrees of granularity with respect to body bias application. Particular examples of such variation are shown in FIG. 2A and FIG. 2B.

Figures 2A, 2B:
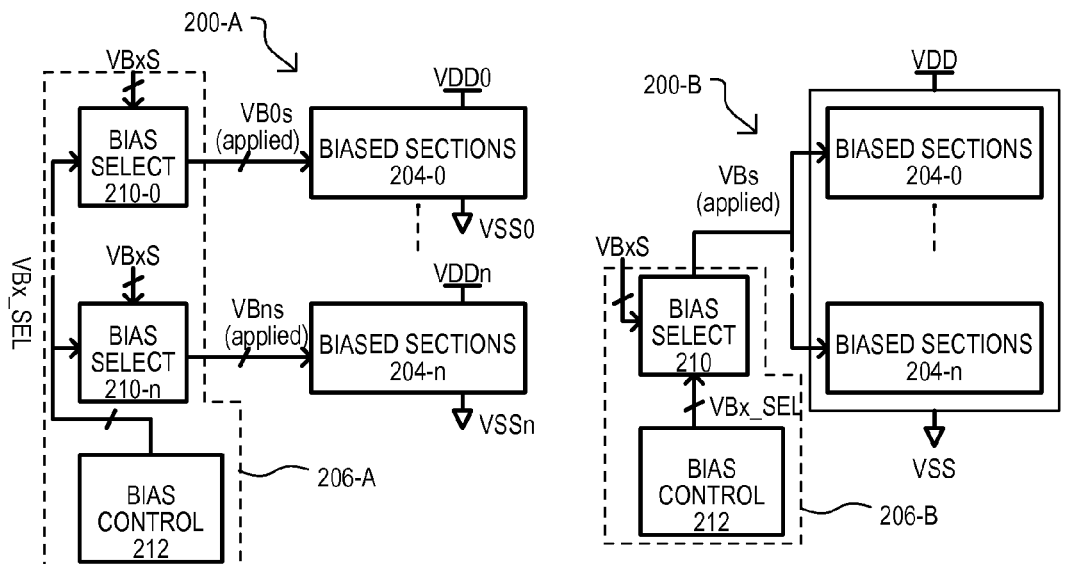
FIG. 2A shows an IC device having inter-device body bias granularity according to an embodiment.
FIG. 2B shows an IC device having single device body bias granularity according to an embodiment.

Referring to FIG. 2A, an IC device 200-A according to an embodiment is shown in a block schematic diagram. IC device 200-A shows a "fine" grained body biasing arrangement wherein transistors in different circuit sections of the same IC device can be independently biased by applying different body bias voltages. IC device 200-A can include biased sections 204-0 to 204-$n$ and a bias control section 206-A. Biased sections 204-0 to 204-$n$ can include circuits connected between high power supply voltage(s) (VDD0 to VDDn) and low power supply voltages (VSS0 to VSSn). In some embodiments such high and low power supply voltages can be the same (i.e., VDD0=VDDn and/or VSS0=VSSn), while in other embodiments such supply voltages can be different between sections. In particular embodiments, all or a portion of the transistors within each biased sections (204-0 to 204-$n$) can be EBE transistors having screening regions that can be coupled to one or more body bias voltages (VB0$s$ to VBns).

A control section 206-A may include bias select circuits 210-0 to 210-$n$ and a bias control circuit 212. In the embodiment of FIG. 2A, there can be a bias select circuit (210-0 to 210-$n$) corresponding to each biased section (204-0 to 204-$n$). Each bias select circuit (210-0 to 210-$n$) can receive a set of bias voltages (VBxS), and selectively connect one or more of the bias voltages to the corresponding biased section (204-0 to 204-$n$) based on selection values (VBx_SEL) generated from bias control circuit 212. Bias control circuit 212 can generate selection values (VBx_SEL) based on the performance of one or more emulation circuits (not shown) as described above and in other embodiments herein.

Referring to FIG. 2B, an IC device 200-B according to another embodiment is shown in a block schematic diagram. IC device 200-B shows a "medium" grained body biasing arrangement in which all, or substantially, all biased sections (204-0 to 204-$n$) receive the same body bias voltage(s). Biased sections 204-0 to 204-$n$ can all be connected between a same high power supply voltage (VDD) and low power supply voltages (VSS). Some or all of biased sections (204-0 to 204-$n$) can also include EBE transistors having screening regions that can be coupled to one or more body bias voltages (VBs).

A control section 206-B may include a bias select circuit 210 and a bias control circuit 212. Bias select circuit 210 can receive a set of bias voltages (VBxS) and selectively connect one or more of the bias voltages to biased section 204 based on selection values (VBx_SEL) generated from bias control circuit 212. Bias control circuit 212 can have the same structure as that shown in FIG. 2A, or an equivalent.

Figure 3:
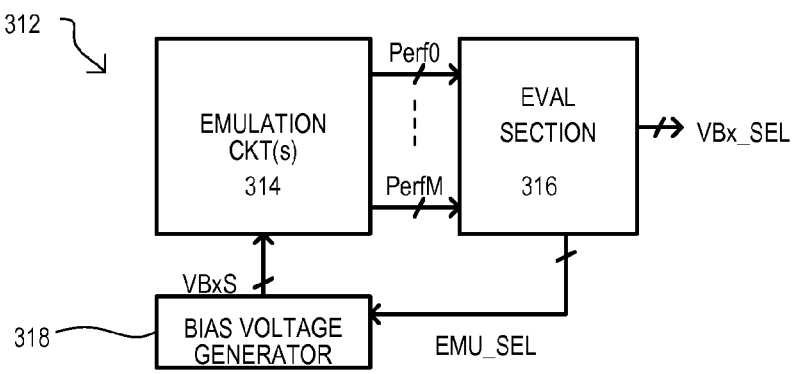
FIG. 3 shows a bias control circuit according to an embodiment.

Referring now to FIG. 3, a bias control circuit 312 according to one particular embodiment is shown in a block schematic diagram. Bias control circuit 312 can be included in embodiments shown herein.

A bias control circuit 312 can include emulation circuits 314, an evaluation section 316, and a bias voltage generator 318. Emulation circuits 314 can include circuits having structures like those of biased sections on a same IC device, including EBE transistors having screening regions that may be coupled to a body bias voltage selected by an evaluation section 316. Transistors within emulation circuits 314 can receive body bias voltages (VBxS), and in response to such biases (and optionally other signals, such as input signals), generate performance values Perf0 to PerfM. Preferably, performance values (Perf0 to PerfM) can be digital values. Accordingly, as different body bias voltages (VBxS) are applied to the emulation circuits 314, different sets of performance values (Perf0 to PerfM) can be generated.

Evaluation section 316 can receive sets of performance values (Perf0 to PerfM) corresponding to different body bias conditions, and from such sets arrive at bias voltage selection values (VBx_SEL) that can be used to select body bias voltage(s) for application to other biased circuit section(s) of the same device. In the embodiment shown, evaluation section 316 may also generate emulator selection signals (EMU_SEL) for selecting body bias voltages for application to emulation circuits 314.

Bias voltage generator 318 may generate a number of bias voltages and provide a selected number of such voltages (VBxS) to emulation circuits 314 in response to selection signals (EMU_SEL). In one embodiment, the emulation circuits 314 can generate multiple sets of performance values that are stored in the evaluation section 316, where each set of performance values corresponds to the selected number of bias voltages (VBxS) provided by the bias generator in response to a particular emulator selection signal (EMU_SEL).

Figure 4:
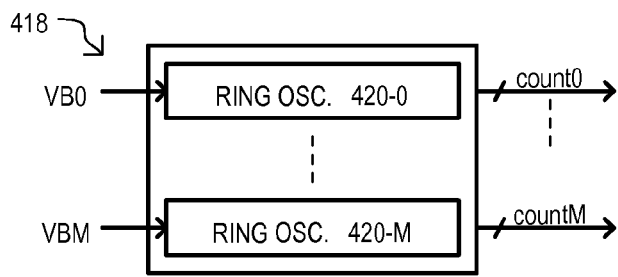
FIG. 4 shows emulation circuits according to an embodiment.

Referring to FIG. 4, emulation circuits 418 that can be included in the embodiments are shown in a block schematic diagram. Emulation circuits 418 can include a number of ring oscillators 420-0 to 420-M, each of which can receive one or more body bias voltages VB0$s$ to VBMs. Ring oscillators (420-0 to 420-M) can include circuit structures corresponding to other biased circuit sections of an IC. The frequency at which a ring oscillator (420-0 to 420-M) oscillates can correspond to a speed of the circuits contained therein, as such circuits receive particular body bias voltages. Consequently, the frequency of a ring oscillator (420-0 to 420-M) can represent a speed response of the corresponding biased circuit section in the IC.

In the particular embodiment shown, emulation circuits 418 can provide a count value (count0 to countM) corresponding to each ring oscillator (420-0 to 420-M). A count value (count0 to countM) can represent a number of oscillation cycles within a set period of time, and hence represent the oscillation speed of an oscillator and thus the propagation delay of the constituent circuits.

Figure 5:
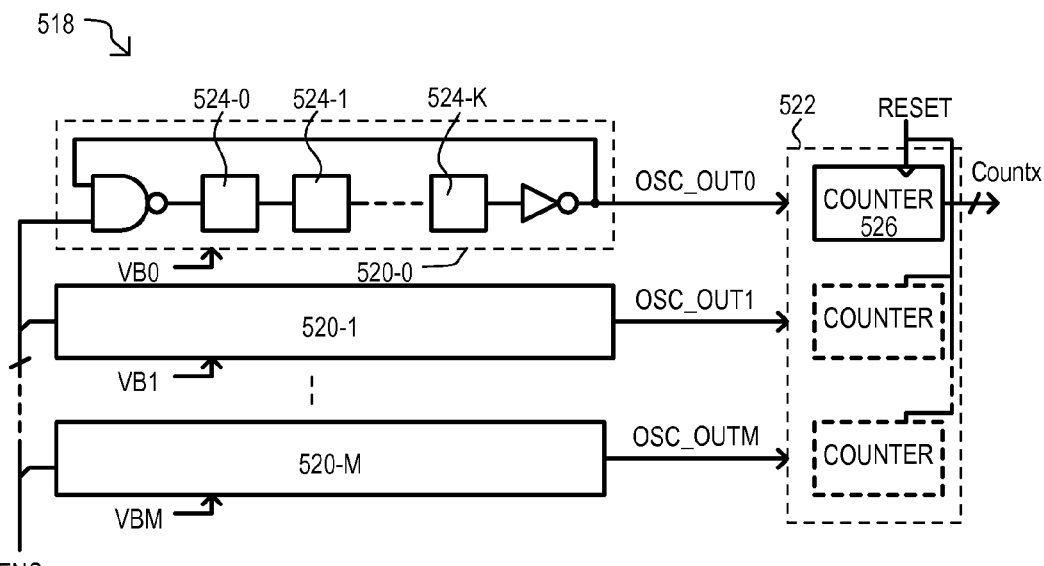
FIG. 5 shows emulation circuits according to another embodiment.

Referring to FIG. 5, a further example of emulation circuits 518 that can be included in the embodiments is shown in a block schematic diagram. Emulation circuits 518 can include ring oscillators 520-0 to 520-M and a counter section 522. Each ring oscillator (520-0 to 520-M) can generate a periodic signal (OSC_OUT0 to OSC_OUTM) having a frequency that varies according to the construction of the ring oscillator, as well as the body bias applied. Ring oscillators (520-0 to 520-M) can include stages (some shown as 524-0 to 524-$k$). Each stage (524-0 to 524-$k$) can include transistors connected to one another in a fashion that emulates biased circuit sections in the same IC. Stages (524-0 to 524-$k$) can be identical replicas of existing circuits, or may be representative of critical timing paths within an IC. As but a few examples, stages (524-0 to 524-$k$) can include a mixture of logic gate type (e.g., inverters, NAND gates, NOR gates, more complex gates) and/or can include dynamic circuits, as well as metal interconnects on different metal layers to evaluate the as-processed RC delay impact on IC critical timing paths.

In addition, as will be described in more detail below, stages (524-0 to 524-$k$) may also include "skewed" circuits. Skewed circuits can include transistor sizings and/or construction purposely introduced to derive other features of a circuit. As but one example, stages (524-0 to 524-k) may be skewed to provide slower speeds when a bias condition increases leakage. In the embodiment shown, each ring oscillator (520-0 to 520-M) can be reset and/or disabled by control signals ENS.

A counter section 522 may include one or more counter circuits (one shown as 526) that may increment and/or decrement a count value in response to an output from a ring oscillator (OSC_OUT0 to OSC_OUTM). Such a count value can be reset by a signal RESET. In some embodiments, a counter circuit 526 can be provided for each ring oscillator (520-0 to 520-M). In other embodiments a counter circuit can be shared among multiple (including all) ring oscillators (520-0 to 520-M).

Figure 6:
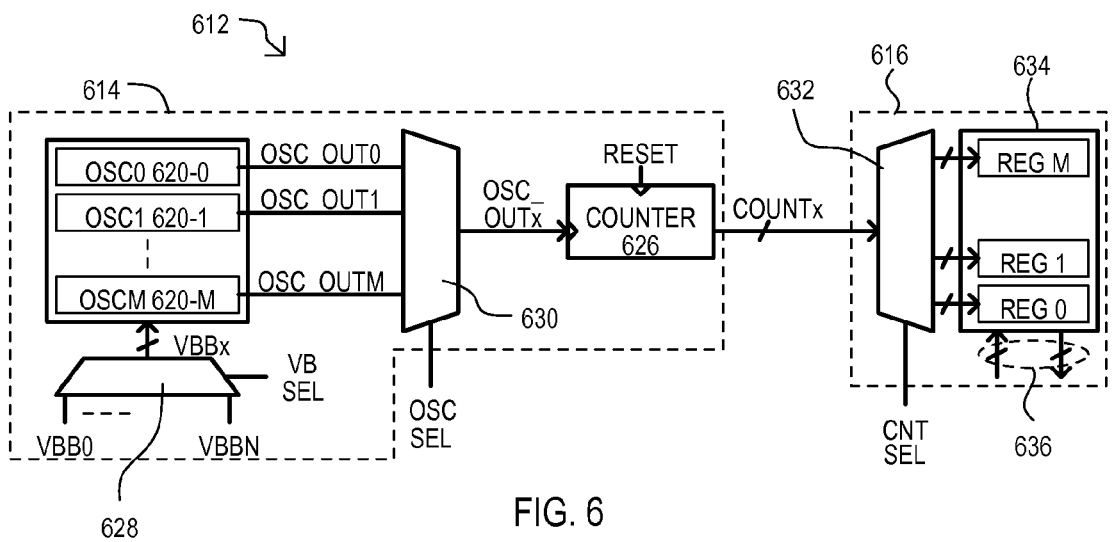
FIG. 6 shows a bias control circuit according to an embodiment.

Referring to FIG. 6, a bias control circuit 612 according to a particular embodiment is shown in a block schematic diagram. A bias control circuit 612 may include emulation circuits 614 and an evaluation section 616. Emulation circuits 614 may include ring oscillators 620-0 to 620-M as described above, and equivalents. In the embodiment shown, emulation circuits 614 may further include a bias voltage multiplexer (MUX) 628 and an oscillator MUX 630. Bias voltage MUX 628 can provide any of a number of bias voltages VBB0 to VBBN to ring oscillators (620-0 to 620-M) in response to bias select signals VB SEL. Oscillator MUX 630 can provide outputs from any of ring oscillators (620-0 to 620-M) to counter circuit 626 in response to oscillator select signals OSC SEL.

Evaluation section 616 may include a counter de-MUX 632 and a count store 634. A counter de-MUX 632 can selectively apply count values from counter circuit 626 to storage locations within count store 634. A count store 634 may store count values generated by emulation circuits 614 for evaluation and/or modification to arrive at selection values that determine which body bias voltages are applied to biased sections within the IC. In the very particular embodiment of FIG. 6, a count store 634 may include a number of storage registers for storing multi-bit count values. Storage locations within count store 634 can be accessed via a store interface (I/F) 636. In one very particular embodiment, a store I/F 636 may include an address input and data input/output (I/O). In an alternative embodiment, the count store 634 can be part of SRAM on the IC. In other embodiments, the store I/F 636 can be a memory interface, and the count store 634 can be accessed using memory mapped I/O or direct memory interfaces (DMA).

Evaluation sections, according to embodiments shown herein, can receive performance values from emulation circuits biased using a number of body bias voltages, and select one or more body bias voltages for application to the transistors in a biased section of an IC. In certain embodiments, an evaluation section can select body bias voltages that provide one or more predetermined performance criteria when applied to the biased section of an IC. Such performance criteria can include speed and leakage current. In certain alternative embodiments, the performance values can include the impact of variations in resistance and capacitance of signal routing layers, and the evaluation section can select body bias voltages that provide one or more predetermined performance criteria in presence of such as-fabricated variations. In certain embodiments, the emulation circuits can use metal limited paths to emulate the resistance and capacitance of signal routing layers as fabricated in the IC, and generate performance values that include the impact of the signal routing layers on the speed of biased circuit sections of the IC. For example, emulation circuits can emulate the impact of variations in the resistance of the signal routing layer resulting from etch rates and lithography, and variations in the capacitance of the signal routing layer resulting from as-fabricated differences in line spacing both horizontally (intra-layer) and vertically (inter-layer), lithography, etch rates, and polish rates. Embodiments of evaluation sections can select body bias voltages that provide a biased section having speed and/or leakage current that are within a specified range.

In certain alternative embodiments, evaluation sections select body bias voltages that provide a biased section having a speed that is greater than a specified minimum speed and the lowest leakage current that can be obtained for that minimum speed. In certain embodiments, the evaluation sections can select a first body bias voltage for biasing the NMOS transistors and a second body bias voltage for biasing the PMOS transistors in the biased section. In certain alternative embodiments, the evaluation sections can select different body bias voltages for biasing the NMOS and PMOS transistors in the biased section. Evaluation sections may take various forms, a few of which are described below.

Figure 7A:
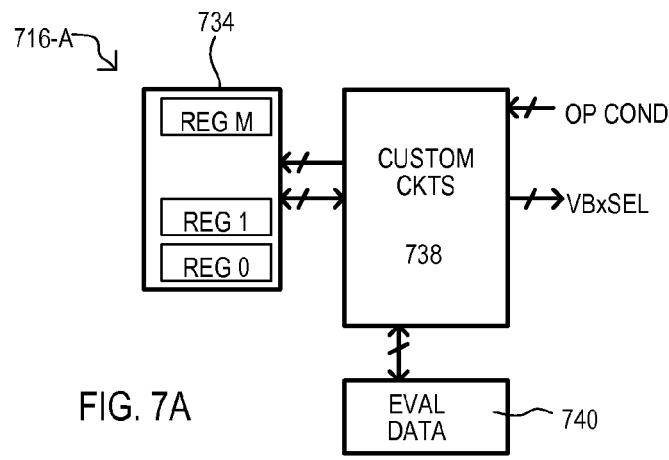
FIGS. 7A to 7C show evaluation sections according to various embodiments.
Figure 7B:
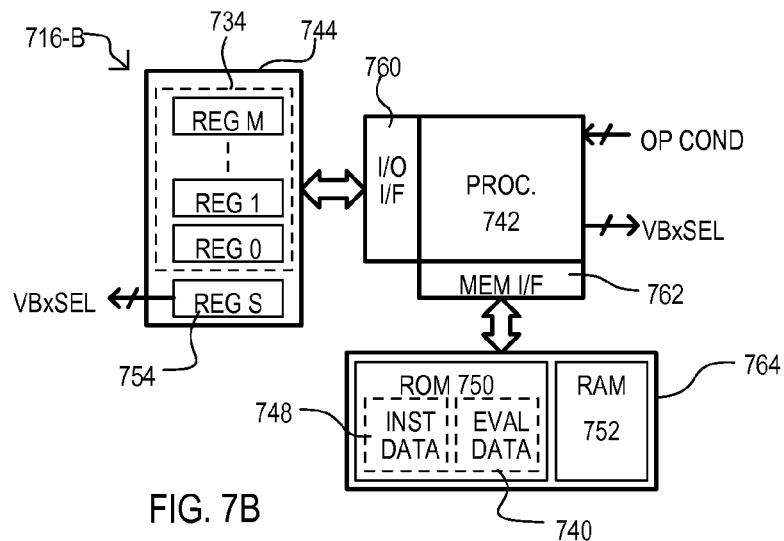
Figure 7C:
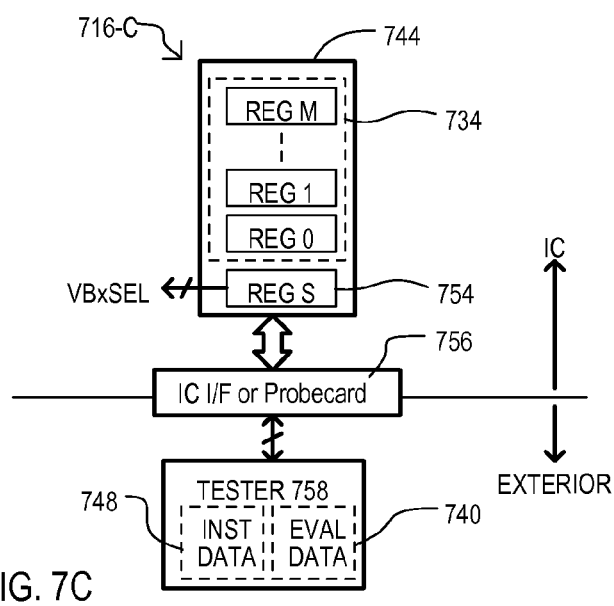

Referring now to FIGS. 7A to 7C, evaluation sections that can be included in the embodiments are shown in block schematic diagrams. Such evaluation circuits are provided as examples of possible embodiments, and various equivalents would be understood by those skilled in the art.

Referring to FIG. 7A, an evaluation section 716-A may include a value store 734, custom or ASIC logic circuits 738, and evaluation data 740. A value store 734 may store performance values from emulation circuits operating under different body bias voltages.

In particular embodiments, a value store 734 may store digital count values corresponding to oscillator speeds. Such count values may be raw, or weighted, as will be described in more detail herein.

Logic circuits 738 can compare performance values to evaluation data contained in an evaluation store 740. Such evaluation data may include limits to which performance data values are compared. Utilizing such evaluation data, logic circuits 738 can derive selection values VBxSEL. Custom circuits 738 can also receive operating conditions (OP COND), and further derive body bias values from such input values. Operating conditions can include temperature and/or actual supply voltage received, as but two examples. It is understood that the logic circuits can include comparators and/or suitable state machines to derive selection values. Particular approaches to generating such values will be described in more detail below.

In particular embodiments, the logic circuits 738 can include a look-up table that can be used to generate the selection values from the performance values and the operating conditions.

Referring to FIG. 7B, an evaluation section 716-B according to another embodiment may include a register set 744, a processor 742, and a memory system 764. A register set 744 may include a number of registers accessible by a processor through an I/O I/F 760. A register set 744 may encompass a value store 734, with a subset of the registers storing performance data for evaluation. A register set 744 may also include one or more control registers 754 that can store selection values (VBxSEL) which may determine body bias voltages applied to circuit sections on the device.

As noted above, a processor 742 may access register set 744 via I/O I/F 760. In addition, a processor 742 may access memory system 764 via a memory I/F 762. A memory system 764 may store evaluation data 740 as well as instruction data 748. A processor 742 may execute instructions included in instruction data memory 748, and using evaluation data 740, to generate selection values VBxSEL. Selection values VBx- SEL can then be written to a control register 754, to thereby control which body bias voltages are applied to a biased circuit section. A processor 742 can also receive operating conditions (OP COND), as described above, and further modify selection values VBxSEL in response to such conditions or changes in such conditions. In alternative embodiments, the registers 734 can be memory-mapped, i.e., specific reserved memory addresses can be assigned to the registers 734, and the processor 742 can access the registers 734 using the memory interface 762.

In the particular embodiment shown, a memory system 764 may include nonvolatile memory 750 and volatile memory 752 for use by processor. Evaluation data 740 and instruction data can be stored in nonvolatile memory 750 or alternatively in RAM 752.

Referring to FIG. 7C, an evaluation section 716-C according to a further embodiment may include a register set 744, an IC interface 756, and an IC tester 758. A register set 744 can take the form of that shown in FIG. 7B, or an equivalent. An IC interface 756 may be an interface that enables electrical communication with an IC containing register set 744. In some embodiments, an IC interface 756 may be a package interface such as a socket for receiving a packaged IC, or a test (e.g., JTAG) interface. However, in other embodiments an IC interface 756 may be compatible with the IC in wafer or die form, including a "probe card", as but one example.

A tester 758 may access register set 744 via IC interface 756. In addition, a tester 758 may store evaluation data 740 as well as instruction data 748. It is noted that in alternate embodiments, a tester 758 may not necessarily read data values from registers to derive performance data. As but one example, a tester 758 could do any of the following: apply different back bias voltages directly to emulation circuits and/or read performance data directly (in analog or digital form). In addition, a tester 758 may also select bias voltage values in response to additional criteria such as operating temperature of the device and/or testing environment.

While embodiments above have shown evaluation sections that generate selection values (VBxSEL) and/or store such values in a register, alternate embodiments may store selection values (VBxSEL) in non-volatile form, including but not limited to: the setting of fusible links, anti-fuse structures and/or the programming of nonvolatile memory cells.

It is also noted that depending upon known variation among fabricated devices, a derived body bias setting from a sample set could be programmed into a larger production set. As but one example, body bias settings could be common for die in like areas of a wafer, in a same wafer lot, or a same production run, as but a few examples. In certain embodiments, the body bias voltages can be selected during wafer testing, when the wafer characteristics are measured across sites on the wafers, and a wafer mean value or a weighted value based on the wafer mean value can be used to select the body bias voltages for all the dies on the wafer. In alternative embodiments, the body bias voltages for a particular die on the wafer can be selected based on measurements obtained from wafer sites near the die.

As noted above, performance values from emulation circuits can be utilized to derive bias voltages for corresponding circuit sections on the same IC. One very particular approach to selecting body bias voltages that meet a minimum speed requirement, while exhibiting low leakage current, will now be described.

FIG. 8A is an example of a table of performance values 859 derived from ring oscillator count values generated using one or more ring oscillators having stages formed with CMOS inverters. In this example, each performance value was derived from a ring oscillator count value that was obtained from a ring oscillator biased using the NMOS reverse bias voltage (nmos VBBR) and the PMOS reverse bias voltage (pmos VBBR) listed in the table. The performance values shown in FIG. 8A were obtained by subtracting a count value representing a predetermined minimum speed from each ring oscillator count value, and therefore, negative performance values correspond to bias points that do not satisfy the predetermined minimum speed. It is understood the p-channel reverse body bias values (pmos VBBR) can be voltages greater than a high power supply voltage (e.g., VDD). Similarly, n-channel reverse body bias values (nmos VBBR) can be voltages less than a low power supply voltage (e.g., VSS). The body bias voltages shown in FIG. 8A (e.g., 0 to 0.5) are provided as examples of possible body bias voltages. In certain embodiments, the table of performance values can be generated using NMOS and PMOS body bias voltages that are different from the values shown in FIG. 8A. In alternative embodiments, the table of performance values can be sparsely populated, i.e., the table can have performance values for only certain combinations of NMOS and PMOS body bias voltages.

In FIG. 8A, the noted count values 860 (i.e., positive count values) represent bias conditions that meet the predetermined minimum speed requirement (i.e., negative values represent too slow a response).

As noted above, in the embodiment shown, body bias voltage values can be selected not only to meet a predetermined minimum speed requirement, but also selected to provide the lowest leakage current when operating at the predetermined minimum speed. In certain alternative embodiments, body bias voltage values are selected to provide a predetermined leakage current when operating at the predetermined minimum speed. In some embodiments, actual current leakage values can be measured for each body bias voltage combination, and the body bias voltages are selected to provide the lowest leakage current case that still meets the predetermined minimum speed. Alternative embodiments use a leakage reduction table to determine the body bias voltages that provide the lowest leakage current while meeting the predetermined minimum speed, as described below.

FIG. 8B shows an example of a leakage reduction table 861 in accordance with one embodiment. The leakage reduction table 861 provides leakage reduction coefficients for various combinations of NMOS and PMOS reverse body bias voltages, as illustrated in FIG. 8B. The leakage reduction coefficients shown in table 861 are obtained from leakage current values normalized to a no reverse body bias case (i.e., nmos VBBR=pmos VBBR=0 V) as a result of subtracting the leakage current for the reverse body bias case from the leakage current for each bias point in the table. The leakage current values used to obtain table 861 are obtained from simulations performed at nominal process conditions. However, in alternative embodiments the leakage current reduction coefficients can be obtained from measuring the leakage current or derived from equations that provide the dependence of the leakage current on the NMOS and PMOS bias voltages. It can be observed from FIG. 8B that increasing the NMOS and PMOS reverse bias voltage results in increased absolute values of leakage reduction coefficients, and therefore an improvement in leakage current reduction. FIG. 8B shows how the "frontier" cases can represent points of interest. Frontier cases are shown as 862 and represent bias conditions that exist next to those that are too slow (not in the set 860 shown in FIG. 8A). In the particular embodiment of FIG. 8B, the bias conditions [nmos VBBR=0.2V; pmos VBBR=0.4V for a leakage reduction coefficient having an absolute value of 0.87], annotated by a circle in FIG. 8B, provides a lowest leakage current case that also meets the minimum speed criterion. From the data shown, other bias conditions also provide a low leakage current that is within a certain range of the lowest leakage current, and meets the minimum speed criterion [nmos VBBR=pmos VBBR=0.3V for a leakage reduction coefficient having an absolute value of 0.84; and nmos VBBR=0.1, pmos VBBR=0.5, for for a leakage reduction coefficient having an absolute value of 0.85].

FIG. 8C shows an example of a leakage reduction table 863 in accordance with one embodiment. The leakage reduction table 863 corresponds to skewed process conditions having a slow PMOS and fast NMOS process. The leakage reduction coefficients in table 863 are obtained from leakage current values for simulations performed at the slow P-fast N process corner. It can be observed from FIG. 8C that for the process corner corresponding to table 863, increasing the NMOS reverse bias voltage results in a larger increase in the absolute value of the leakage reduction coefficients as compared to the increases obtained from increasing the PMOS reverse bias voltage. Therefore, for the process corner corresponding to table 863, increasing the NMOS reverse bias voltage results in a greater improvement in leakage current as compared to the improvement in leakage current that is obtained from increasing the PMOS reverse bias voltage. The frontier cases 864 for this process corner are obtained from a performance value table (not shown) corresponding to the slow P-fast NMOS corner. For the embodiment shown in FIG. 8C, there are two bias conditions that provide the lowest leakage current and meet the predetermined minimum speed [nmos VBBR=pmos VBBR=0.3 for an absolute leakage reduction coefficient of 0.85; and nmos VBBR=0.4, pmos VBBR=0.2 for an absolute leakage reduction coefficient of 0.85]. These bias points are annotated with circles in FIG. 8C. The frontier cases 864 are obtained from a performance value table analogous to the table 859 of FIG. 8A, where the frontier cases 864 can be obtained from emulation circuits 418 for the slowP-fastN skew condition.

As noted above, in some embodiments the leakage reduction coefficients in the leakage reduction table can be obtained from either measurements or simulations that provide the current leakage values for each of the (or the selected) body bias cases in the table. However, in other embodiments, the leakage reduction coefficients in the table are obtained from equations that provide bias points that can be weighted based on expected leakage contribution of each device type (i.e., NMOS/PMOS) for each of the (or the selected) body bias cases in the table. In particular, the leakage reduction coefficients can be obtained based on an inverse square root relationship dependence of the leakage current with respect to the applied reverse body bias voltage. FIGS. 8D, 8F, and 8G show examples of leakage reduction tables obtained from equations relating the leakage current to the reverse body bias voltages, and associated embodiments for selecting the reverse body bias voltages that provide the lowest leakage current and meet a predetermined minimum speed.

FIG. 8D shows an example of a leakage reduction table 865 in accordance with one embodiment. The leakage reduction table 865 corresponds to typical process conditions having a typical PMOS and typical NMOS process. The leakage reduction coefficients in table 865 are obtained from equations that assume equal contributions to the leakage current for the PMOS and NMOS transistors. It can be observed from FIG. 8D that the PMOS and NMOS reverse bias voltages result in a substantially comparable increase in the absolute values of the leakage reduction coefficients. The frontier cases 866 for this process corner are obtained from the performance value table 859, and represent bias conditions that exist next to those that are too slow (not in the set 860 shown in FIG. 8A). In the embodiment shown in FIG. 8D, the bias condition that provides the lowest leakage current and meets the predetermined minimum speed is [nmos VBBR=pmos VBBR=0.3 for an absolute leakage reduction coefficient of 1.10]. This bias condition is annotated with a circle in FIG. 8D.

FIG. 8E shows an example of a leakage reduction table 867 in accordance with one embodiment. The leakage reduction table 867 corresponds to a skewed process with fastP-slowN process conditions having a fast PMOS and slow NMOS. The leakage reduction coefficients in table 867 are obtained from simulations performed at the fast-slow process corner. It can be observed from FIG. 8E that the PMOS reverse bias voltage has a stronger effect on the leakage reduction coefficient than the NMOS reverse bias voltage, i.e., the increasing the PMOS reverse bias voltage provides a greater improvement in leakage current as compared to the improvement obtained from increasing the NMOS reverse bias voltage. The frontier cases 868 for this process corner are obtained from a performance value table (not shown) for the fast-slow process corner. In the embodiment shown in FIG. 8E, the bias condition that provides the lowest leakage current and meets the predetermined minimum speed is [nmos VBBR=0.2, pmos VBBR=0.5 for an absolute leakage reduction coefficient of 0.93]. This bias point is annotated with a circle in FIG. 8E.

FIG. 8F shows an example of a leakage reduction weighting table 869 in accordance with one embodiment. The leakage reduction table 869 corresponds to a skewed process with fastP-slowN process conditions having a fast PMOS and slow NMOS. The leakage reduction coefficients in table 869 are obtained from equations that assume a greater contribution to leakage current from the PMOS transistors as compared to that from the NMOS transistors. In particular, the leakage reduction coefficients in table 869 are obtained from those in table 867 by weighting the effect of the PMOS reverse bias voltage up by 40% and by weighting the effect of the NMOS reverse bias voltage down by 40%. It can be observed from FIG. 8F that the PMOS reverse bias voltage has a stronger effect on the leakage reduction coefficient than the NMOS reverse bias voltage, i.e., the increasing the PMOS reverse bias voltage provides a greater improvement in leakage current as compared to the improvement obtained from increasing the NMOS reverse bias voltage. The frontier cases 870 for this process corner are obtained from a performance value table (not shown) corresponding to the fastP-slowN process corner. In the embodiment shown in FIG. 8F, the bias condition that provides the lowest leakage current and meets the predetermined minimum speed is [nmos VBBR=0.2, pmos VBBR=0.5 for an absolute leakage reduction coefficient of 1.18]. This bias condition is annotated with a circle in FIG. 8F.

FIG. 8G shows an example of a leakage reduction weighting table 871 in accordance with one embodiment. The leakage reduction table 871 corresponds to a skewed process with slowP-fastN process conditions having a slow PMOS and fast NMOS. The leakage reduction coefficients in table 871 are obtained from equations that assume a greater contribution to leakage current from the NMOS transistors as compared to that from the PMOS transistors. In particular, the leakage reduction coefficients in table 871 are obtained from those in table 867 by weighting the effect of the PMOS reverse bias voltage down by 40% and by weighting the effect of the NMOS reverse bias voltage up by 40%. It can be observed from FIG. 8G that the NMOS reverse bias voltage has a stronger effect on the leakage reduction coefficient than the PMOS reverse bias voltage, i.e., the increasing the NMOS reverse bias voltage provides a greater improvement in leakage current as compared to the improvement obtained from increasing the PMOS reverse bias voltage. The frontier cases 872 for this process corner are obtained from a performance value table (not shown) corresponding to the slowP-fastN process corner. In the embodiment shown in FIG. 8G, the bias condition that provides the lowest leakage current and meets the predetermined minimum speed is [nmos VBBR=0.4, pmos VBBR=0.2 for an absolute leakage reduction coefficient of 1.10]. This bias condition is annotated with a circle in FIG. 8G.

As illustrated by the embodiments discussed above, the PMOS and NMOS transistors can make an unequal contribution to the leakage current at different process corners, and therefore, the leakage reduction coefficients can have a stronger dependence on either the PMOS reverse bias voltage or the NMOS reverse bias voltage in accordance with the process skew. For the embodiment shown in FIG. 8F PMOS is skewed up by a skew factor of 40% and NMOS is skewed down by a skew factor of 40%. For the embodiment shown in FIG. 8G, PMOS is skewed down by a skew factor of 40%, and NMOS is skewed up by a skew factor of 40%. One of skill in the art would understand, that NMOS and PMOS skew factors other than 40% can be used to determine the leakage reduction coefficients in the table. In certain embodiments, the performance value weights can be adjusted based on the relative NMOS and/or PMOS transistor content (e.g., total transistor width) in a particular IC. In alternative embodiments, the performance value weights can also be adjusted based on differences in leakage current attributable to stack effects, i.e., stacked transistors (such as stacked PMOS transistors in NOR or stacked NMOS transistors in NAND gates) as they occur in the design and affect the overall leakage current of the IC.

As noted above, performance values can be weighted. In particular, performance values can be weighted to favor leakage control when one type of device (i.e., NMOS or PMOS) dominates due to the as-fabricated NMOS to PMOS skew of the IC. In embodiments having ring oscillators, weighted values can be extracted by purposely designing transistor size (channel width/length (Z)) ratios. The effect of each device can then be derived with linear algebra. A very particular example is shown in FIG. 9.

Figure 9:
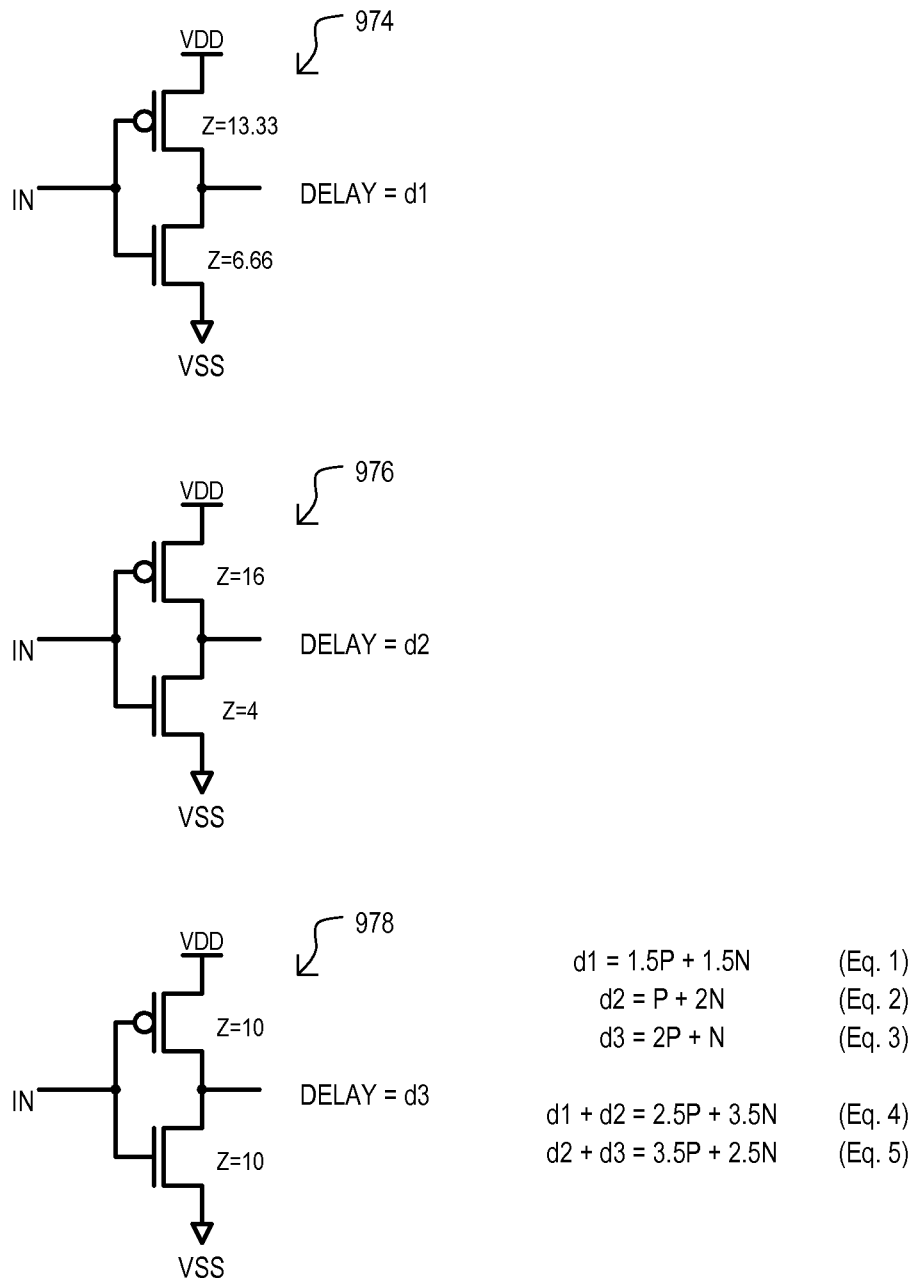
FIG. 9 shows an embodiment that determines NMOS and PMOS skew factors using a plurality of skewed ring oscillators having a predetermined ratio between the NMOS transistor size and the PMOS transistor size.

FIG. 9 illustrates an embodiment that determines the NMOS and PMOS skew factors using a plurality of skewed ring oscillators, where each ring oscillator consists of inverters having a predetermined ratio of the PMOS transistor size to the NMOS transistor size. FIG. 9 shows three differently skewed inverters 974, 976 and 978 having corresponding delays d1, d2 and d3, respectively. The delay d1 can be determined from a ring oscillator that uses inverter 974. Similarly, delays d2 and d3 can be determined from ring oscillators that use inverters 976 and 978, respectively. Sizing of transistors corresponds to the delay contribution of the transistor, as shown in equations Eq. 1 to Eq. 3. The resulting relationships, shown in equations Eq. 4 and Eq. 5 can be solved to derive the delay contribution of the PMOS and NMOS transistors, and therefore the PMOS and NMOS skew factor. FIG. 9 shows but one example at determining device contribution.

The PMOS and NMOS skew factors can determine the leakage reduction coefficients for a particular process skew. In certain embodiments the PMOS and NMOS skew factors are used to calculate the leakage reduction table corresponding to the process skew by using the NMOS and PMOS skew factors to weight the leakage reduction table obtained for a typical-typical process corner (as illustrated by the embodiments illustrated in FIGS. 8F and 8G). The leakage reduction table for the typical-typical process corner can be obtained from measurements, simulations, or equations that provide the NMOS and PMOS leakage current contributions at the typical-typical process corner. In certain alternative embodiments, the leakage reduction table corresponding to the skewed process is obtained from applying the NMOS and PMOS skew factors to a leakage reduction table for a predetermined process skew. The leakage reduction table for the predetermined process skew can be obtained from measurements, simulations, or equations that provide the NMOS and PMOS leakage current contributions at the predetermined process skew.

In certain other embodiments, a number of leakage reduction tables can be available, where each leakage reduction table corresponds to a process skew. In this embodiment, the leakage reduction table used to select the bias voltages can be determined by interpolating between the available leakage reduction tables based on the NMOS and PMOS skew factors.

Figures 10A, 10B:
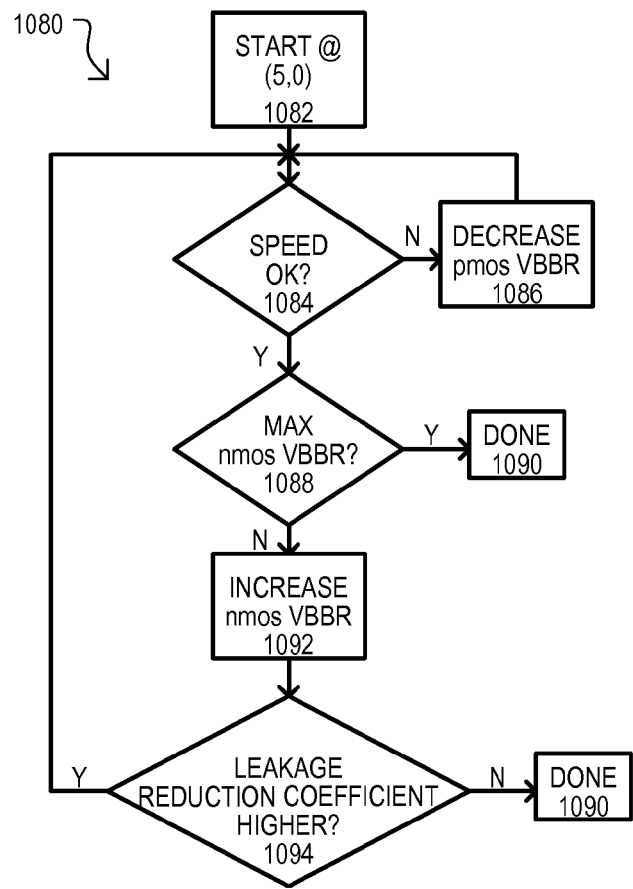
FIGS. 10A and 10B show a method for determining optimal bias setting according to an embodiment.

Referring to FIGS. 10A and 10B, a method for arriving at an optimal bias value according to one embodiment is shown. FIG. 10A is a flow diagram of the method 1080. FIG. 10B represents data values usable by the method, and shows bias setting of a data array by coordinate values. The method assumes operation on a set of leakage reduction coefficients like those of FIG. 8F or 8G.

A method 1080 can include starting at one corner of the data array (1082), which can be the upper right corner (data point 5, 0). If a performance feature (in this example speed) is not satisfactory at this point (N from 1084), the method can decrease a pmos VBBR 1086 and return to 1084. If a performance feature is satisfactory (Y from 1084), the method can determine if a maximum value nmos VBBR has been reached (1088). In one embodiment, a set of performance values like those in FIG. 8A can be used to determine if the performance feature is satisfactory in step 1084. If a maximum value nmos VBBR has been reached (Y from 1088), method 1080 can be complete (1090) and the current data point can correspond to the selected bias values to be applied to the operational circuits on the IC. However, if a maximum value nmos VBBR has not been reached (N from 1088), the method can increase an nmos VBBR (1092). An absolute leakage reduction coefficient at a current position can then be compared to a previous absolute leakage reduction coefficient (1094). If a leakage reduction coefficient has not increased (N from 1094), method 1080 can be complete (1090) and the previous data point can correspond to the selected bias values. However, if a leakage reduction coefficient has increased (Y from 1094), the method can return to 1084.

While the above embodiments have shown selection of reverse body bias voltages to arrive at an optimal speed and leakage case, other embodiments may include different types of biasing for different features. As but one example, forward body biases can be applied to arrive at some optimized set. In embodiments using forward body bias voltages, the performance value tables and the leakage reduction tables discussed in the embodiments above can be extended to negative VBBR values to select forward body bias voltages to be applied to biased sections of the IC.

In this way, a performance value (in this case oscillator speed) can be weighed by known responses (in this case current leakage), to arrive at an optimal body bias selection for both features (speed and leakage).

The various embodiments shown herein can include n-channel EBE transistors, and/or p-channel EBE transistors, as well as conventional transistors. N-channel EBE transistors will be represented in this disclosure by the symbol shown as 1196-0 in FIG. 11A, and p-channel EBE transistors will be represented in this disclosure by the symbol shown as 1196-1 in FIG. 11A.

Referring now to FIG. 11B, one exemplary representation of an EBE transistor is shown in a side cross sectional view, and designated by the general reference character 1196. EBE transistor 1196 is formed on a substrate 1101 and includes a gate 1198, source and drain regions 1113, and a gate insulator 1103 positioned over a channel 1105. The channel 1105 is positioned above a highly doped screening region 1107. The screening region 1107 can be formed below channel region 1105. It is understood that certain embodiments of the EBE transistor can include other optional layers that are positioned between channel region 1105 and screening region 1107 (e.g., a threshold voltage set region 1109). In certain embodiments the substrate 1101 may be formed of more than one semiconductor layer. As but one example, a substrate may include one or more "epitaxial" layers formed on a bulk semiconductor substrate.

A screening layer 1107 may be doped to an opposite conductivity type of the transistor channel type (e.g., an n-channel EBE transistor will have a p-doped screening layer). The screening layer 1107 doping concentration may be greater than a concentration of a body region 1111 to which screening layer 1107 is coupled. In certain embodiments the screening layer 1107 can be adjacent to a well having the same dopant type as the screening layer 1107. In certain embodiments, dopant concentration profile of the screening layer 1107 is the result of using a method in which the objective is to form a substantially uniform dopant concentration profile laterally across the channel. Such methods can include doped epitaxial growth, precision ion implantation, atomic layer deposition or other methods, as will be understood by persons skilled in the art. FIG. 11B also shows source and drain regions 1113 on opposing lateral sides of channel region 1105. Source and drain regions 1113 may include a source and drain diffusion. More particular types of EBE source and drain structures, relative to the channel region 1105 will be described in more detail below.

As described above, certain embodiments of the EBE transistor can optionally also include a threshold voltage set region 1109 with a dopant concentration less than the screening region 1107, positioned between the gate dielectric 1103 and the screening region 1107. The threshold voltage set region permits small adjustments in operational threshold voltage of the EBE transistor 1196 and can be formed by out diffusion from the screen layer, in-situ or delta doping during epitaxial growth, or with tightly controlled implants. In particular, that portion of the channel adjacent to the gate should remain undoped. In still other embodiments, in-situ epitaxial growth, screen layer out-diffusion, or other dopant positioning method can be used to place a significant amount of dopants throughout the channel, including doping a portion of the channel adjacent to the gate. Such slightly doped channel transistors can provide better matching to conventional or legacy transistors, which can be advantageous when interfacing with various transistor types or limiting required circuit redesign when substituting improved transistors as disclosed for conventional transistors.

Referring now to FIG. 11C, an EBE transistor according to another particular embodiment is shown in a side cross sectional view. The EBE transistor 1196' may include a gate 1198' separated from a substrate 1101 by a gate insulator 1103. A gate 1198' may include insulating sidewalls 1115 formed on its sides. Source and drain regions may include lightly doped drain (LDD) structures 1113' formed over deep source/drain diffusions 1119 to extend towards each other under a portion of the gate. An EBE stacked channel structure may be formed by a low-doped or substantially undoped channel region 1105' preferably formed using epitaxial growth, a threshold voltage (Vt) set layer 1109' formed by epitaxial growth and implant, or alternatively, by controlled out-diffusion from a screening layer 1107' positioned below the undoped channel region 1105'. The screening layer 1107' acts to define termination of the depletion zone below the gate, while the Vt set layer 1109' adjusts Vt to meet transistor design specifications. In the embodiment shown, screening layer 1107' may be implanted into body/bulk region 1101 so that it extends between and in contact with the source and drain diffusions 1119.

An EBE transistor according to a further embodiment is shown in FIG. 11D, and designated by the general reference character 1196". An EBE transistor 1196" may include items like those shown in FIG. 11C, and like items are referred to by the same reference character. EBE transistor 1196" differs from that of FIG. 11C in that screening layer 1109" may be implanted into body/bulk region 1101 so that it extends below the gate without contacting the source and drain diffusions 1119.

The above EBE transistors are but particular implementations of an EBE transistor, and should not construed as unduly limiting the circuit elements included within the various analog or digital circuit embodiments shown herein.

In certain embodiments, the EBE transistor can be a N-channel transistor having a source and a drain made of N-type dopant material, formed upon a substrate such as a P-type doped silicon substrate providing a P-well 1111 formed on substrate 1101. However, it will be understood that, with appropriate change to substrate or dopant material, a non-silicon P-type semiconductor transistor can be formed from other suitable substrates, such as Gallium Arsenide materials can be substituted.

As will be understood, various devices can be created by providing suitable doping to the EBE transistor structure of FIG. 11B, using ion implantation, diffusion, deposition, or other techniques suitable for introducing dopants into a material. These modifications can be made before epitaxial layer growth, during epitaxial growth (by in-situ growth or the like), or after epitaxial growth. In one embodiment the highly doped screening region structure 1107 is implanted as a thin layer in well 1111. Such a screening region can increase body bias efficacy by providing a dopant plane/region that more effectively couples body bias circuitry to the EBE transistor structure, and thereby, advantageously modifies transistor operation.

Position, dopant concentration, and thickness of the screening region 1107 can be important factors in EBE transistor design. In certain embodiments, peak concentration of the screening region defines the edge of the depletion region under the gate and the screening region is located below the bottom of the source and drain junctions. In other embodiments the screening region may be located close to a gate, and contact the source and drain junctions. Typically, in operation, the channel 1105 is deeply depleted, with the screening region 1107 acting in whole or in part to define termination of a depletion region under a gate. The screening region can be formed using a variety of precision doping techniques including, delta doping, broad implantation, or in-situ substitutional doping. Typically the screening region has a finite thickness of about 5 to 50 nanometers, although thicker layers are possible. When transistors are configured to have such screening regions, the transistor can simultaneously have good threshold voltage matching, high mobility, high output resistance, low junction leakage, good short channel effects, and still have an independently controlled and strong body effect.

In certain embodiments, the screening region 1107 is doped to have a concentration between about $5\times10^{18}$ dopant atoms per cm$^3$ and about $1\times10^{20}$ dopant atoms per cm$^3$ of dopant material of the opposite type from the source and drain dopants, significantly more than the dopant concentration of the channel region 1105, and at least slightly greater than the dopant concentration of the optional voltage threshold set region 1109. As will be appreciated, exact dopant concentrations, screening region thicknesses and screening region depths can be modified to improve desired operating characteristics of EBE transistor 1196, or to take in to account available transistor manufacturing processes and process conditions.

Together the structures and methods of making the structures allow for EBE transistors having an enhanced body coefficient as compared to conventional nanoscale devices. Thus, the response of the EBE transistor can vary within a wider range to a change in the body bias voltage applied to the screening region. More specifically, the enhanced body coefficient of the EBE transistor can allow a broad range of ON-current and the OFF-current that depends on the body bias voltage applied to the screening region, as compared to the body bias voltage applied to a conventional device. In addition, the EBE transistors have a lower $\sigma V_T$ (threshold voltage variation) than conventional devices. The lower $\sigma V_T$ provides a lower minimum operating voltage VDD and a wider range of available nominal values of $V_T$. The enhanced body coefficient of the EBE transistor can also allow a broad range of threshold voltage that depends on the body bias voltage applied to the screening region, as compared to the body bias voltage applied to a conventional device. The screening region allows effective body biasing for enhanced control of the operating conditions of a device or a group of devices to be set by controlling the applied body bias voltage. In addition, different operating conditions can be set for devices or groups of devices as result of applying different body bias voltages.

Advantageously, EBE transistors created in accordance with the foregoing embodiments, structures, and processes, can have a reduced mismatch arising from scattered or random dopant variations as compared to conventional MOS transistors. In certain embodiments, the reduced variation results from the adoption of structures such as the screening region, the optional threshold voltage set region, and the epitaxially grown channel region. In certain alternative embodiments, mismatch between EBE transistors can be reduced by implanting the screening layer across multiple EBE transistors before the creation of transistor isolation structures, and forming the channel region as a blanket epitaxial layer that is grown before the creation of transistor epitaxial structures. In certain embodiments, the screening region has a substantially uniform concentration of dopants in a lateral plane. The EBE transistor can be formed using a semiconductor process having a thermal budget that allows for a reasonable throughput while managing the diffusivities of the dopants in the channel. Further examples of transistor structure and manufacture suitable for use in EBE transistors are disclosed in U.S. patent application, Ser. No. 12/708,497, filed on Feb. 18, 2010, titled ELECTRONIC DEVICES AND SYSTEMS, AND METHODS FOR MAKING AND USING THE SAME, by Scott E. Thompson et al., as well as U.S. patent application Ser. No. 12/971,884, filed on Dec. 17, 2010 titled Low Power Semiconductor Transistor Structure and Method of Fabrication Thereof and U.S. patent application Ser. No. 12/971,955 filed on Dec. 17, 2010 titled Transistor with Threshold Voltage Set Notch and Method of Fabrication Thereof the respective contents of which are incorporated by reference herein.

Static and/or dynamic body biasing as described herein can be applied to various types of circuits. It is noted that the embodiments for selecting body bias voltages described above can be used to select body bias voltages for EBE transistors, conventional transistors, or a combination of EBE and conventional transistors. For embodiments that select body bias voltages for EBE transistors, the selected body bias voltages are applied to the screening region of the EBE transistor. For embodiments that select body bias voltages for conventional transistors, the selected body bias voltages are applied to the body or substrate of the conventional transistor. Particular examples of body biased circuits that can be biased using the selected body bias voltages include operational circuits (e.g., circuits biased with a selected body bias) and/or emulation circuits will now be described. It is noted that in the embodiments described below, the body biased circuits are shown to include only EBE transistors. It is understood that alternate embodiments could include a mix of EBE transistors and conventional transistors, or no EBE transistors.

Figure 12:
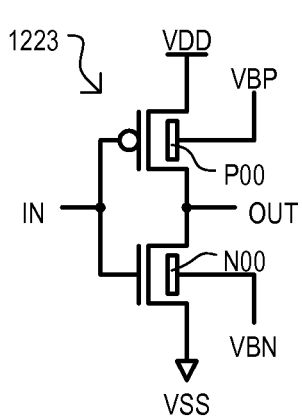
FIG. 12 shows a logic circuit according to an embodiment.

FIG. 12 shows a complementary device logic circuit 1223 according to an embodiment. The particular embodiment of FIG. 12 shows an inverter formed by a p-channel EBE transistor P00 and an n-channel EBE transistor N00 having source, drain and gate connections like a CMOS inverter. Unlike a conventional CMOS inverter, in which a PMOS device has a body connected to a high power supply voltage VDD and an NMOS device has a body connected to a low power supply voltage VSS, the transistors of logic circuit 1223 have bodies connected to different bias nodes (VBP and VBN). Body bias voltages for application to such nodes can be selected, as described herein, to optimize one or more device performance features.

While FIG. 12 shows an inverter, in other embodiments, the same body biasing arrangement can be applied to other types of circuits, including but not limited to, other logic circuits (e.g., NAND gates, NOR gates).

The separate body biasing of both n-channel and p-channel EBE devices can allow for greater adjustment than conventional approaches. In CMOS circuits using conventional transistors, as the transistors scale to smaller sizes, the body coupling coefficient diminishes. In contrast, due in part to its highly doped screening layer (noted above), an EBE transistor can have an enhanced body coupling coefficient, enabling greater changes in transistor performance parameters, e.g., threshold voltage and leakage current, per unit change in body bias.

The enhanced body coefficient of EBE transistors can be used to improve device performance over that achievable with conventional transistors. As but a few examples, if process or operating conditions result in p-channel EBE transistors with threshold voltages (Vtp) that are too high when body biased with VDD (which can make the device too slow), a forward body bias (VBPF<VDD) can be applied to arrive at the desired speed. Similarly, if n-channel EBE transistors have threshold voltages (Vtn) that are too low when body biased with VSS (which can make the device fast but leaky), a reverse body bias (VBNR<VSS) can be applied to reduce the leakage, while maintaining an adequate speed.

Still further, in some embodiments, body biasing techniques as described herein can be used to set the threshold voltage of the transistors. In particular, transistors can be manufactured with a process having a target threshold voltage (assuming zero body bias conditions) that is lower than a desired operational threshold voltage. Reverse body biasing may then be used to arrive at desired threshold voltages and performance of the device. One very particular example of a target processing (absolute) threshold voltage can be 0.3 V under zero body bias conditions. Reverse body biasing can raise such threshold voltages as needed to meet performance targets.

Biased transistors as described herein can be applied to circuits other than standard logic circuits, and the body bias voltages can be selectively applied with even finer granularity, such different body bias voltages being applied to different NMOS and PMOS transistors in the same circuit. As additional examples, according to embodiments, level shifter circuits may be modified to enable lower operating voltages.

Figure 13:
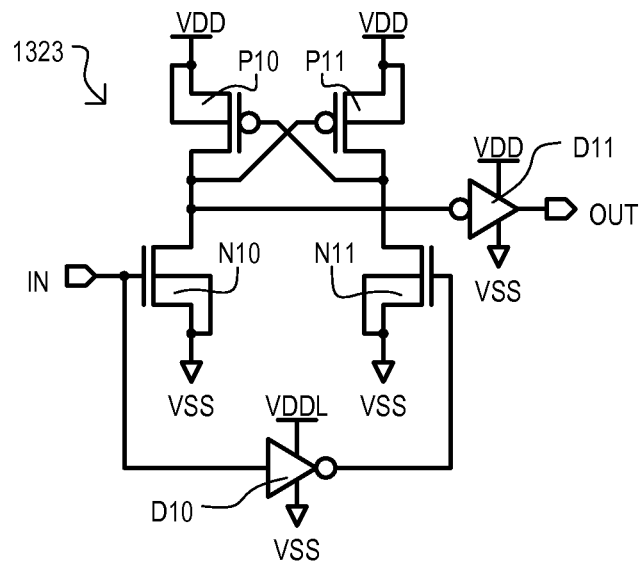
FIG. 13 shows a conventional level shifter circuit.

FIG. 13 shows a conventional level shifter circuit 1323. Conventional level shifter 1323 can span two high voltage domains: VDD and VDDL, where VDDL<VDD. In the conventional case, gates of NMOS devices N10 and N11 will receive input signals that vary between VSS and VDDL. The PMOS devices P10 and P11 operate with a gate-to-source voltage (VGS) with respect to the high VDD. In the conventional level shifter 1323, device sizes are ratioed with respect to one another to enable NMOS devices (N10 and N11) to overpower cross-coupled PMOS devices (P10 and P11). However, when VDDL is very low, NMOS devices may not capable of such an operation.

Figure 14:
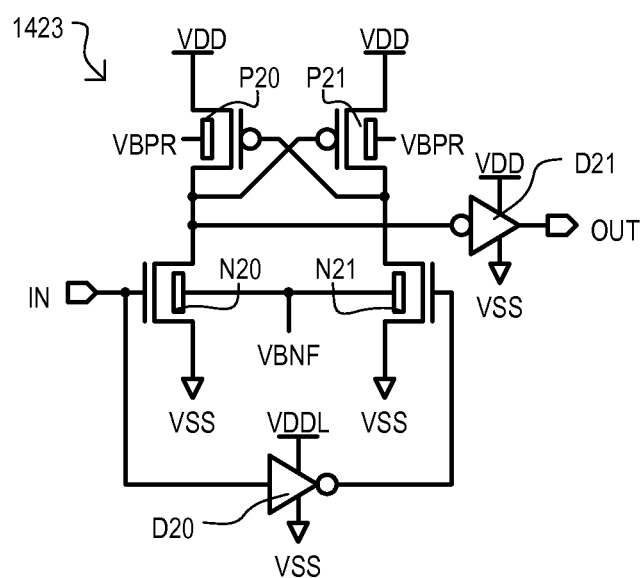
FIG. 14 shows a level shifter circuit according to an embodiment.

FIG. 14 shows a level shifter according to an embodiment. A level shifter 1423 may include EBE devices connected in a fashion like that of FIG. 13. However, n-channel devices N20/N21 can have screening regions that are coupled to a forward body bias voltage (VBNF). In addition or alternatively, p-channel devices P20/P21 can have screening regions that are coupled to a reverse body bias voltage (VBPR). In alternate embodiments, some or all of the transistors in level shifter 1423 may be non-EBE transistors.

In such an arrangement, a level shifter 1423 may operate at lower VDDL levels than conventional approaches, as n-channel devices (N20 and N21) can have increased drive strength at such a lower VDDL, as compared to the conventional case. Further, p-channel devices (P20 and P21) can be overpowered by the n-channel pull down devices to switch at lower VDDL voltage levels.

Body bias voltages VBNF and/or VBPR can be static, or dynamically applied to the level shifter.

Figure 15A:
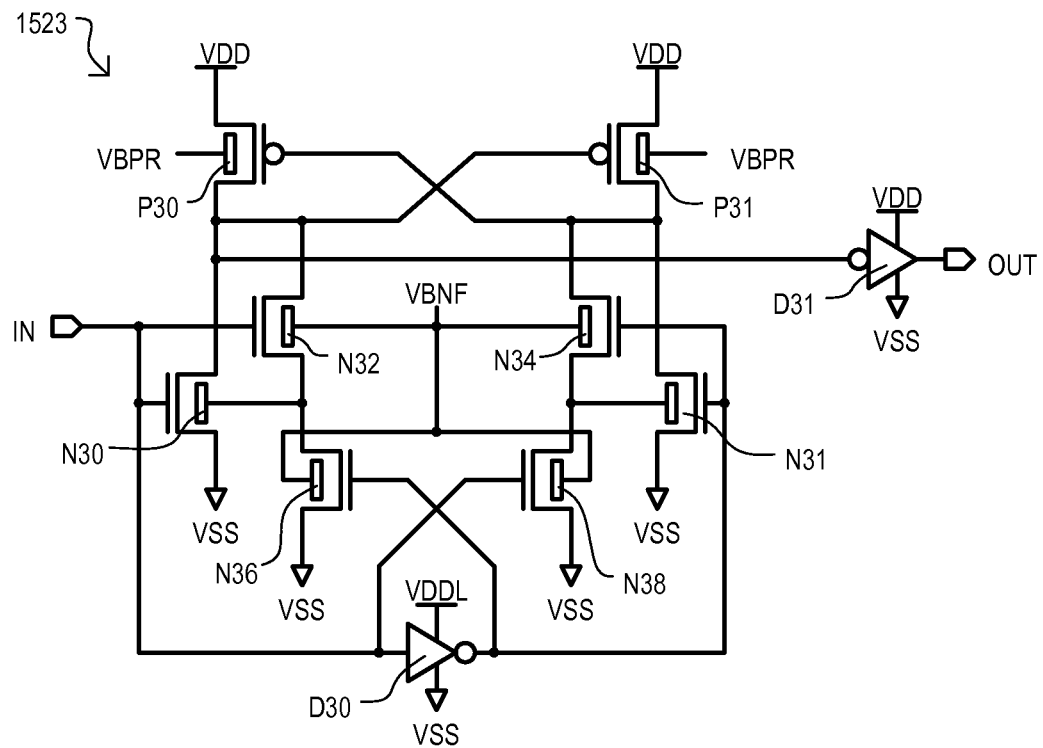
FIG. 15A shows a level shifter circuit according to another embodiment.

FIG. 15A shows a level shifter according to a further embodiment. A level shifter 1523 may include some sections like that shown in FIG. 14. However, unlike FIG. 14, level shifter 1523 further includes n-channel EBE transistors N32/N36 that switch the body bias voltage applied to the n-channel EBE transistor N30, and N34/N38 which switch the body bias voltage applied to the EBE transistor N31. In certain embodiments, N32-N38 can have either zero or reverse body bias applied as required to obtain the most compact layout. Optionally, n-channel transistors N32/N36/N34/N38 can be forward biased using a forward body bias voltage (VBNF). In addition or alternatively, p-channel devices P30/P31 can be reverse biased using a reverse body bias voltage (VBPR).

Figure 16:
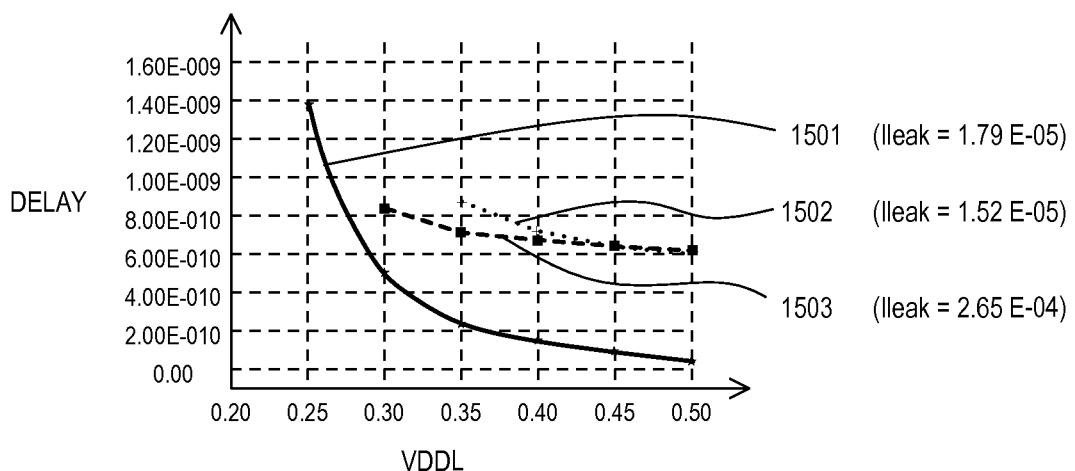
FIG. 16 shows a response for level shifter circuits according to embodiments.

FIG. 16 is a graph showing delays of level shifter circuits described above. Response 1501 shows a level shifter like that of FIG. 15 (no p-channel VBPR applied). Response 1502 shows a "zero body bias" case (a level shifter with n-channel devices at zero body bias). Response 1503 shows a response for a level shifter like that of FIG. 14. Corresponding leakage values (Ileak) are also shown. FIG. 16 shows good level shifter performance at VDDL levels that can cause conventional level shifters to fail.

In this way, biased EBE transistors can enable level shifters to operate at lower voltage supply levels, with leakage currents similar to level shifters using conventional transistors. In another embodiment, PMOS transistors P30 and P31, and NMOS transistors N30 and N31 can be thick gate oxide devices, where PMOS transistors P30 and P31 can be coupled to a higher voltage VDDIO supply that exceeds the core transistor reliable voltage tolerance. In such embodiments, the VDDL can be the core VDD, and the operation of such an embodiment is similar to the embodiment discussed with reference to FIG. 15A. In other embodiments, the PMOS transistors P30 and P31 can be either conventional thick gate oxide transistors or EBE thick gate oxide transistors.

Figure 15B:
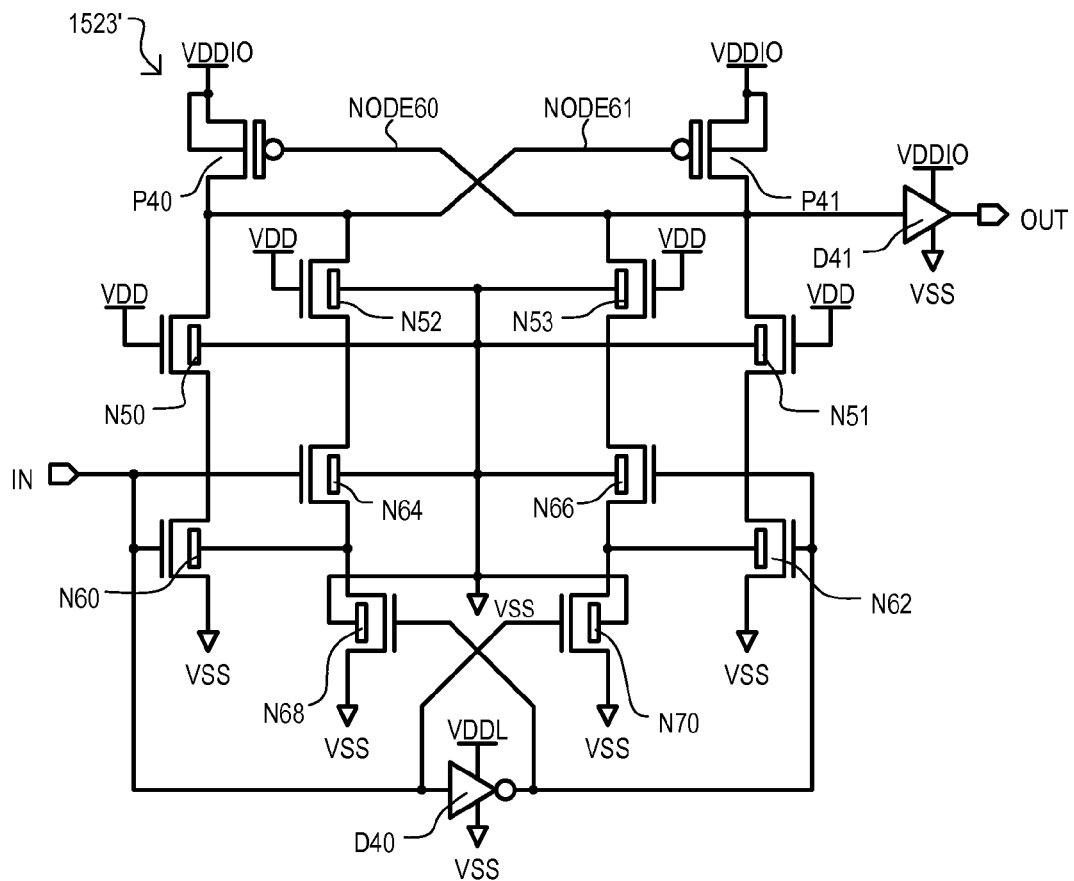
FIG. 15B shows a level shifter circuit according to another embodiment.

FIG. 15B shows a level shifter according to a further embodiment. The level shifter 1523' includes two PMOS transistors P40 and P41 connected to the higher voltage VDDIO supply. In certain embodiments, P40 and P41 can be conventional thick oxide transistors. In certain alternative embodiments, P40 and P41 can be EBE thick oxide transistors. The level shifter 1523' also includes four NMOS transistors N50, N51, N52, and N53 with their gates connected to VDD. Embodiments of the level shifter 1523' can user either EBE or conventional transistors as the NMOS transistors N50-N53. The cascode configuration of these transistors protects the remaining NMOS transistors in the level shifter 1523' from the high VDDIO voltage at NODE60 and NODE61, as the voltage at the source of N50-N53 is set to VDD less the threshold voltage of the corresponding transistor. The level shifter 1523' further includes n-channel EBE transistors N64/N68 that switch the body bias voltage applied to the n-channel EBE transistor N60, and N66/N70 which switch the body bias voltage applied to the EBE transistor N62. In certain embodiments, N64, N66, N68, and N70 can have either zero or reverse body bias applied as required to obtain the most compact layout. Optionally, n-channel transistors N64, N66, N68, and N70 can be forward biased using a forward body bias voltage (VBNF).

According to other embodiments, techniques using fine-grained biased EBE transistors can increase a response speed of logic circuits while at the same time maintaining low levels of leakage. More particularly, for logic circuits having more than one of the same type transistor in series, one of the transistors can have zero or very low body bias voltage, and the remaining transistors in the series can have a forward or reverse body bias voltage.

Figure 17A:
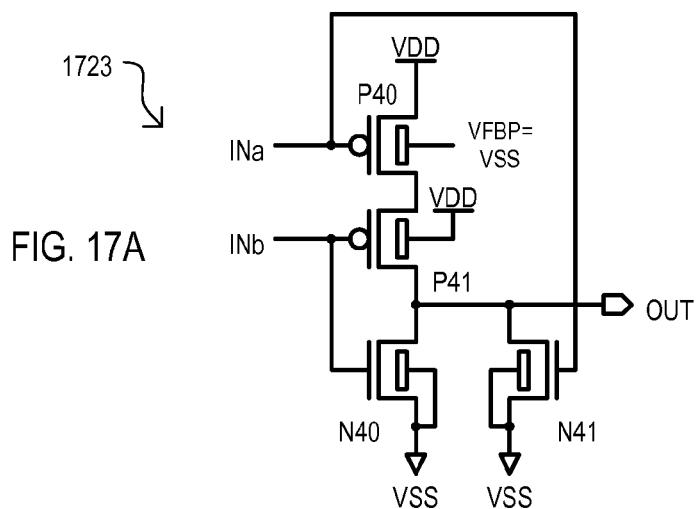
FIGS. 17A to 17C show logic gates according to embodiments.

FIG. 17A shows a logic gate 1723 according to an embodiment. A logic gate 1723 can include p-channel transistors P40/P41 and n-channel transistors N40/N41 connected in a NOR type gate arrangement. As noted above, while FIG. 17 shows EBE type transistors, alternate embodiments can be composed of all, or in part, of conventional NMOS/PMOS transistors. Transistors P40 and P41 are connected in series. However, unlike a conventional approach, transistor P40 can have a forward body bias VFBP. In one very particular embodiment, such a forward body bias can be a low power supply voltage VSS. While the forward body biased transistor P40 could have some increased leakage, series connected transistor P41 is biased using supply voltage VDD to minimize any leakage through P40.

As also described above, such a biasing may be static or dynamic.

Figure 17B:
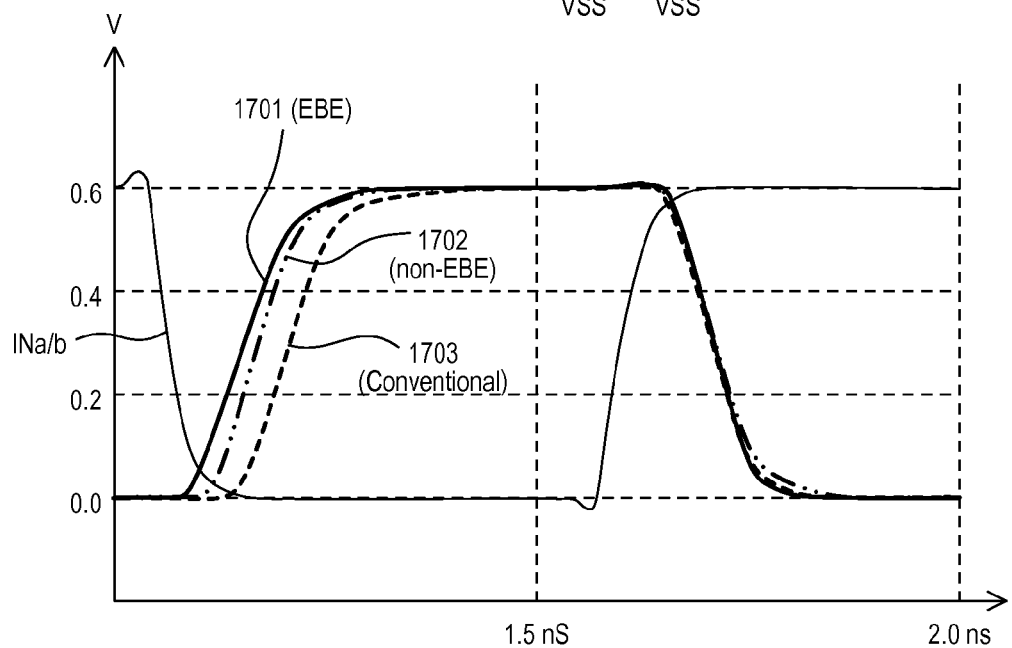

FIG. 17B shows responses for embodiments shown by FIG. 17A. In particular, FIG. 17B shows input signals (INa/b) going low, resulting in output OUT going high. FIG. 17B also shows three output responses 1701, 1702 and 1703. Response 1701 shows a response for an embodiment like that shown in FIG. 17A that includes EBE transistors. Response 1702 shows a response for an embodiment like that shown in FIG. 17A, but without EBE transistors. Finally, response 1703 shows a conventional CMOS NOR gate response. As shown, body biasing can increase a signal propagation speed of a logic gate.

Figure 17C:
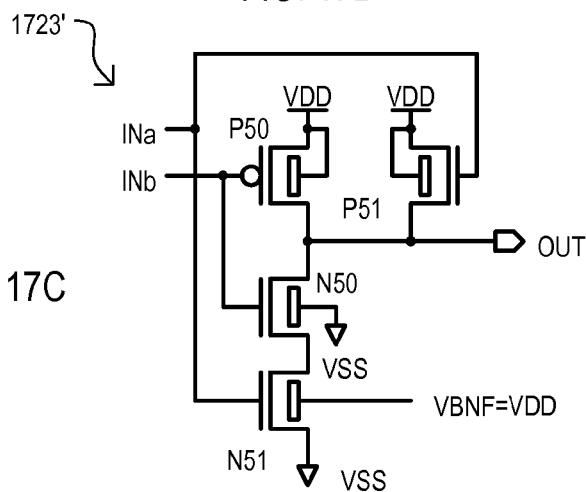

FIG. 17C shows the same general approach for the embodiment of FIG. 17A, but applied to a NAND gate 1723'. Within the series connected n-channel transistors N50 and N51, transistor N51 can have a forward body bias voltage (VBNF), which in a very particular embodiment can be a high power supply VDD.

According to further embodiments, techniques using biased EBE transistors can increase a response speed of sensing circuits, such as those used to sense data values in a static random access memory (SRAM) device. An SRAM device according to one very particular embodiment will now be described with reference to FIGS. 18A to 18D.

Figure 18A:
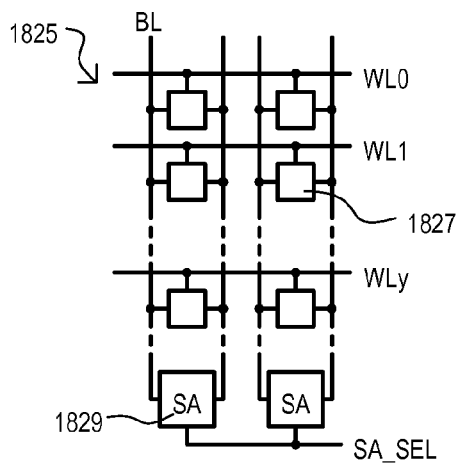
FIGS. 18A to 18D show a static random access memory (SRAM) device and sensing circuit according to embodiments.

FIG. 18A shows an SRAM device 1825 in a block schematic diagram according to one embodiment. An SRAM device 1825 may include a number of memory cells (one shown as 1827), each connected to bit lines (one shown as BL) and a word line (WL0 to WLy). Memory cells (e.g., 1827) can be connected to bit lines by activation of a word line. Sensing circuits (one shown as 1829) can be activated by one or more sense enable signals SA_SEL to sense data values stored in selected SRAM cells. Sensing circuits (e.g., 1829) can use biased EBE transistors to increase sensing speed as described below.

Figure 18B:
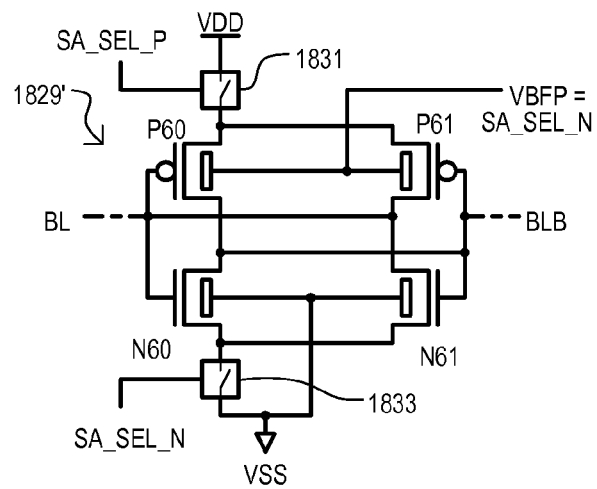

FIG. 18B shows a sensing circuit 1829' according to one particular embodiment. Sensing circuit 1829' can sense a voltage change on a bit line (BL or BLB). In a sensing operation, p-channel devices P60/P61 can be enabled (e.g., have VDD applied to their sources) by a signal SA_SEL_P (which is active low in this embodiment). In addition, in a sensing operation, n-channel devices N60/N61 can be enabled (e.g., have VSS applied to their sources) by a signal SA_SEL_N (which is active high in this embodiment).

As shown in FIG. 18B, p-channel devices P60/P61 can receive a forward body bias voltage VBFP. In a particular embodiment, such a forward body bias voltage can be the same voltage as signal SA_SEL_N, and hence provide dynamic body biasing. In such a case, p-channel EBE transistors P60/P61 can have screening regions that are biased to VSS during the sense operation, but are subsequently biased to VDD after the sense operation.

Figure 18C:
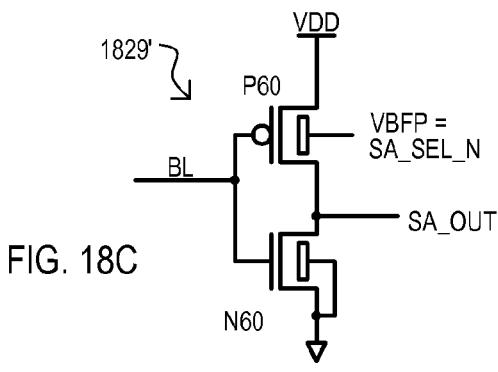

FIG. 18C is a circuit 1829'' illustrating an inverter based single-ended SRAM sensing circuit. Such SRAM sensing circuits can be slower than differential sense circuits, but they can be simpler to design and can have a smaller size. The sensing speed of such single-ended SRAM sense circuits can be substantially improved in certain embodiments that use EBE transistors and use fine grained biasing to selectively control the body bias voltage applied to individual transistors. In the embodiment shown in FIG. 18C, a variable body bias voltage is applied to the PMOS transistor P60, thereby resulting in a smaller layout size since only a separate N-well is required in the layout. This N-well can be shared across multiple sense circuits that use a variable PMOS transistor bias activated with the same SA_SEL_N signal to achieve further reductions in layout size. The NMOS transistor N60 can have a zero body bias voltage, or it can be biased using the body bias voltage applied to other NMOS transistors in a common well arrangement.

Figure 18D:
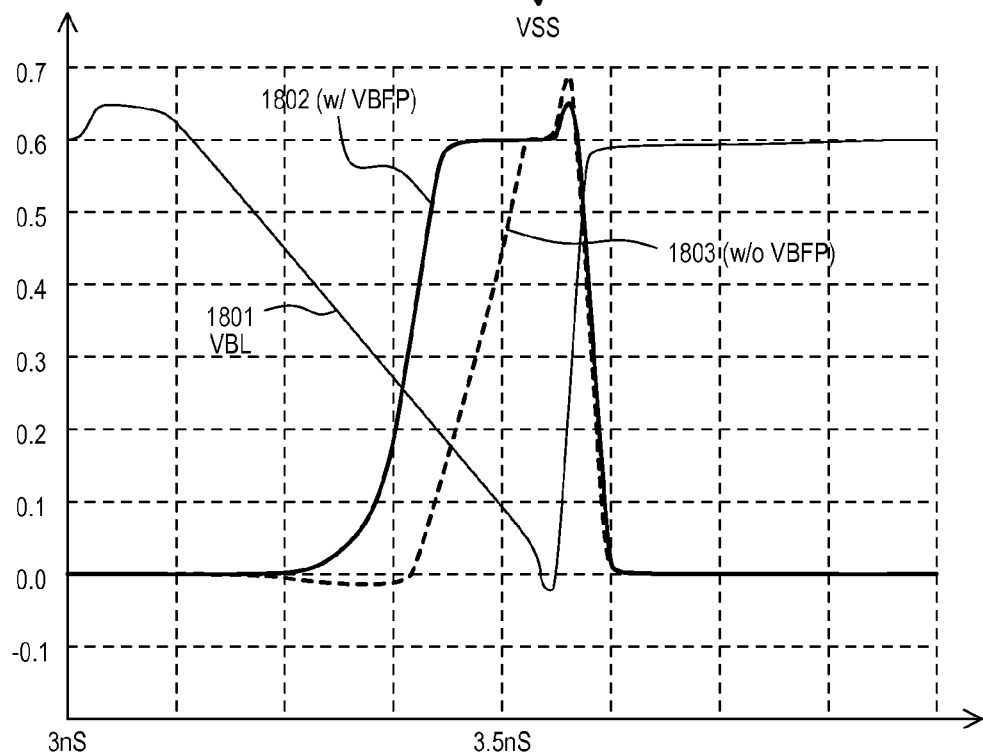

FIG. 18D is a graph showing a response of the circuit of FIG. 18C. FIG. 18D includes an input waveform 1801 (VBL) which can represent a voltage signal development on a bit line sensed by the sensing circuit. FIG. 18D also shows two output responses 1802 and 1803. Response 1802 shows a response for an embodiment like that shown in FIG. 18C that includes a dynamic forward body biasing of a p-channel EBE transistor. Response 1803 shows a response when such a p-channel EBE transistor does not include forward body biasing (e.g., the body bias voltage is maintained at VDD). The forward body biasing can be limited by cascode arrangements as discussed above with reference to embodiments of level shifter circuits.

As shown from the figures, biasing of a memory sensing circuit according to the embodiment can achieve measurable speed advantages.

As understood from the various embodiments herein, an IC device may include multiple bias voltages that may be selected for application to circuits, which serve as emulation circuits used to derive optimal body bias values, or operational circuits to which such optimal values are applied. Examples of bias voltage generator circuits will now be described.

Figure 19A:
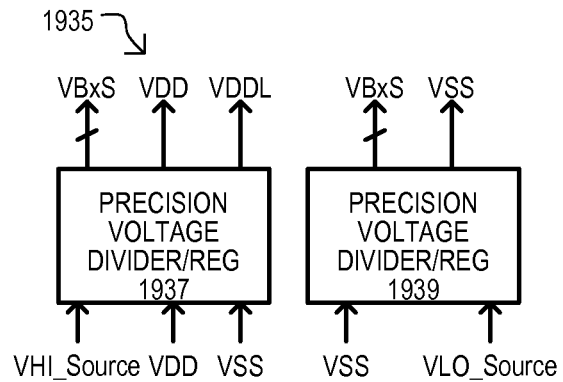
FIGS. 19A to 19C show bias voltage generators that can be included in the embodiments.

FIG. 19A shows a bias voltage generator circuit 1935 that can be included in embodiments. Generator circuit 1935 can receive a high voltage (VHI_Source) from a source external to the IC device. In addition or alternatively, a low voltage (VLO_Source) can also be received from an external source. A high divider/regulator 1937 can voltage divide and/or regulate voltages to arrive at bias voltages VBxS as well as a high power supply voltage VDD (and if needed, a reduced high power supply voltage VDDL). If voltages lower than a low power supply (VSS) are needed, a low divider/regulator 1939 can be included. The VHI source can be a higher supply voltage, e.g., used for compatible I/O, VDDIO, on the same IC, where VDD<VDDIO.

Figure 19B:
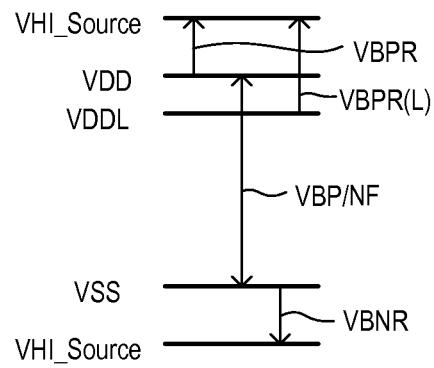

FIG. 19B shows how different bias voltages can be generated relative to source voltages VHI_Source and VLO_Source.

While some embodiments can utilize externally provided voltages, alternative embodiments can generate voltages outside supply ranges on the IC device containing the emulation circuits and biased sections. One example of such an arrangement is shown in FIG. 19C.

Figure 19C:
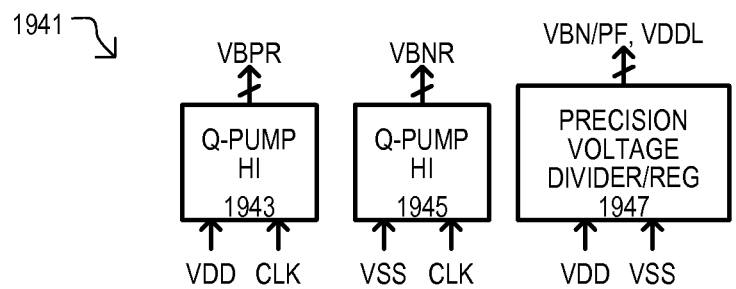

FIG. 19C shows another bias voltage generator circuit 1941 that can be included in embodiments. Generator circuit 1941 can receive a high power supply voltage (VDD), low power supply voltage (VSS), and clock signal (CLK). A high charge pump 1943 can generate voltages greater than a high power supply voltage (VDD) to serve as reverse body bias voltages for p-channel devices (VBPR). A low charge pump 1945 can generate voltages less than a low power supply voltage (VDD) to serve as reverse body bias voltages for n-channel devices (VBNR). Forward body bias voltages for both n-channel and p-channel devices (VBN/F) and a reduced power supply voltage (VDDL) can be generated by voltage divider/regulator 1947 by voltage dividing between high and low power supply voltages.

It is understood that other embodiments can mix the various approaches shown in FIGS. 19A to 19C, including switched capacitor voltage level converters or low drop-out level converters operating at high efficiency.

Figure 20:
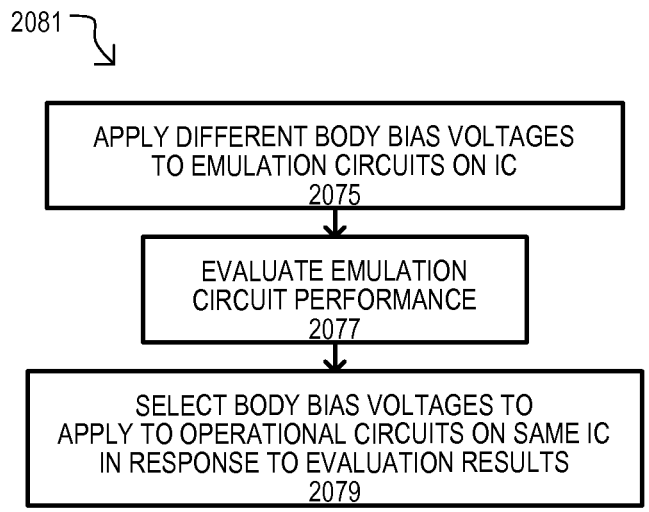
FIG. 20 shows a method according to an embodiment.

Referring now to FIG. 20, a method according to an embodiment is shown in a flow diagram and designated by the general reference character 2081. A method 2081 can include applying different body bias voltages to emulation circuits on an IC (2075). The performance of such emulation circuits can be evaluated (2077). Body bias voltages to apply to operational circuits on the same IC can be selected based on such evaluation results (2079).

Figure 21:
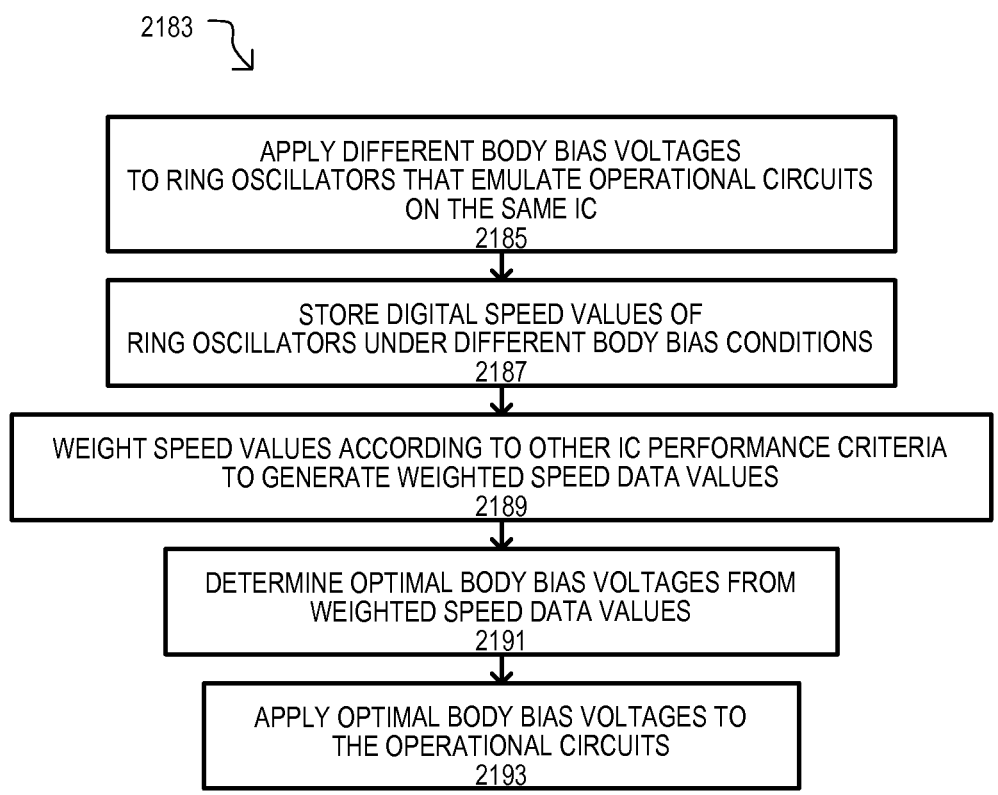
FIG. 21 shows a method according to another embodiment.

Referring now to FIG. 21, a method according to a further embodiment is shown in flow diagram and designated by the general reference character 2183. A method 2183 may include applying different body bias voltages to ring oscillators that emulate operational circuits formed on the same IC (2185). Speed values for the ring oscillators under such different body bias conditions may be stored (2187). Such speed values can be weighted according to other IC performance data to generate weighted speed data values (2189). Optimal body bias voltages can be determined from weighted speed data values (2191). Such optimal body bias voltages can be applied to the operational circuits (2193).

Figure 22:
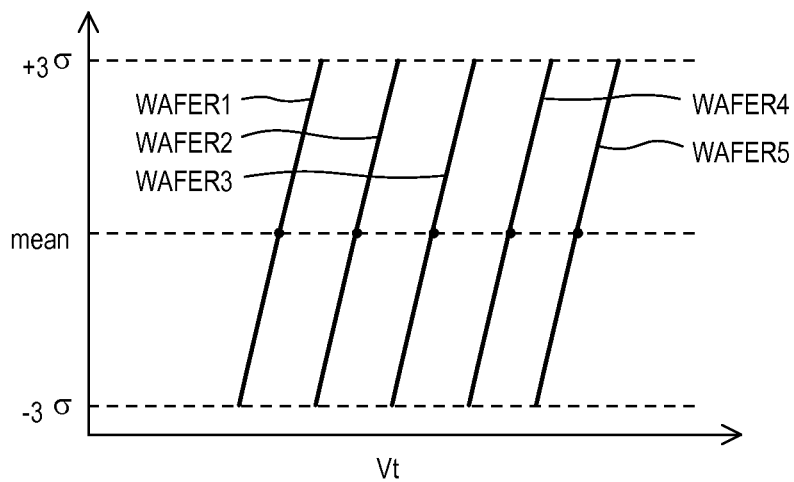
FIG. 22 shows variation of threshold voltage across the wafer for EBE transistors.

Referring now to FIG. 22, a representative wafer level variation of the EBE transistor threshold voltage is shown for a number of wafers. The threshold voltage values shown in FIG. 22 are representative of threshold voltage values that can be obtained from fab E-test data measurements performed across sites on the wafer. It can be observed from FIG. 22 that the EBE transistors exhibit a high degree of uniformity across the wafer, and therefore, in certain embodiments, the body bias voltage can be selected based on a mean value, or some other statistically relevant value that can be determined from the fab E-test data, as discussed in further detail below.

Figure 23:
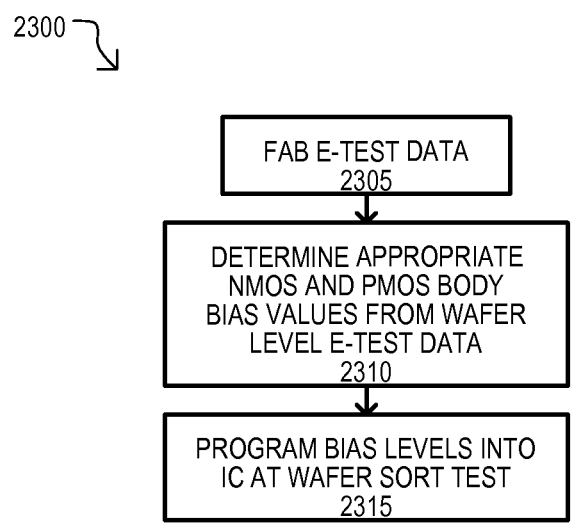
FIG. 23 shows a method according to an embodiment.

Referring now to FIG. 23, a method according to a further embodiment is shown in flow diagram and designated by the general reference character 2300. A method 2300 may include obtaining fab e-test data by performing measurements across sites on the wafers after fabrication (2305). The Fab E-test data can be used to determine appropriate NMOS and PMOS body bias voltage values (2310). In certain embodiments, a mean value determined from the fab E-test data can be used to select the body bias voltage for all the dies on the wafer. This approach is effective for embodiments using EBE transistors because the electrical characteristics of EBE transistors across the wafer exhibit a high degree of uniformity. In certain alternative embodiments, the mean value can be weighted to select the body bias voltage for all the dies on the wafer. In certain embodiments, the mean value can weighted to account for the NMOS and PMOS transistor content of the IC (i.e. the die), and/or the stacked transistor effect. The selected body bias voltages are programmed into the IC during wafer sort testing (2315). In one embodiment, the selected body bias voltages can be programmed into non-volatile storage on the IC, such as read-only-memory (ROM). In an alternative embodiment, the IC can have a configuration of fuses that can be selectively blown to program the selection of a selected body bias voltage for the IC.

The method 2300 can either be used by itself or in combination with embodiments of the other methods for selecting body bias voltages described above. In one embodiment, the method 2183 can be optionally used by a user of the IC in conjunction with the method 2300. In one such embodiment, the method 2300 can be the default method for selecting body bias voltages, and the method 2183 can be used when the default method 2300 is overridden by user selection or as a result of predetermined criteria. For example, the method 2183 can be used to select the body bias voltages and override the method 2300, if the leakage current of the IC is measured to exceed a certain predetermined value. In alternative embodiments, the method 2183 can be the default method it can be overridden by the method 2300 either by user selection or as a result of predetermined criteria. Other embodiments can use a combination of the methods 2081, 2183, and 2300, where the body bias voltage is determined using one of these methods as either a result of user selection, or in accordance with predetermined criteria.

For embodiments that use a leakage reduction table obtained from simulation, the leakage reduction coefficients in the table can be obtained by using a circuit simulation program such as the BERKELEY-SPICE simulation program, the H-SPICE simulation program, the P-SPICE simulation program, or any other circuit simulation program with similar capabilities using transistor parameters and variations in those transistor parameters that reflect the as-manufactured transistor variability for various skewed processes (or process corners). In certain embodiments, some of the leakage reduction coefficients in the leakage reduction table can be obtained from simulation, while the remainder of the leakage reduction coefficients can be obtained from measurements, calculations based on equations governing leakage current as a function of NMOS and PMOS body bias voltages, or from interpolation between leakage reduction coefficients obtained from leakage reduction coefficients available for other available process corners. In certain embodiments the leakage reduction tables can be sparsely populated such that leakage reduction coefficients are only provided for certain combinations of bias voltages.

Circuits and IC devices according to embodiments shown herein, and equivalents, may provide improved performance over conventional circuits by providing body bias conditions optimized for multiple performance parameters. When EBE transistors are employed, the enhanced body coefficient of such transistors can enable greater transistor control with body biasing as compared to conventional transistors. Possible improvements can include faster signal propagation times, lower operating voltages, and/or lower power consumption.

Embodiments may also provide greater threshold voltage control as compared to methods relying on manufacturing processes. Transistor threshold voltages can be tightly tuned to accommodate variations arising from process and/or temperature. As noted above, devices can be fabricated with intentionally low (magnitude) threshold voltages, and precise reverse body bias voltages and be used to arrive at a desired operating threshold voltage.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
at least a first biased section comprising a plurality of biasable NMOS transistors and a plurality of biasable PMOS transistors;
at least one bias generation circuit configured to generate a plurality of bias voltages;
a plurality of performance values, each performance value being associated with an NMOS bias voltage and a PMOS bias voltage of the plurality of bias voltages, each performance value corresponding to a speed of the first biased section when the associated NMOS bias voltage is coupled to the biasable NMOS transistors and the associated PMOS bias voltage is coupled to the biasable PMOS transistors;
a plurality of leakage reduction coefficients, each leakage reduction coefficient being associated with an NMOS bias voltage and a PMOS bias voltage of the plurality of bias voltages, each leakage reduction coefficient corresponding to a leakage current reduction of the first biased section when the associated NMOS bias voltage is coupled to the biasable NMOS transistors and the associated PMOS bias voltage is coupled to the biasable PMOS transistors; and
at least one bias control section responsive to the plurality of performance values and the plurality of leakage reduction coefficients and adapted to selectively couple an NMOS bias voltage to the NMOS biasable transistors and a PMOS bias voltage to the PMOS biasable transistors, such that the selectively coupled NMOS and PMOS bias voltages provide a first biased section having a predetermined minimum speed and a lowest leakage current corresponding the predetermined minimum speed; wherein
the at least one bias control section determines a plurality of candidate performance values that correspond to the first biased section having the predetermined minimum speed, the bias control section further evaluating the candidate performance values and selecting an optimal performance value having an associated leakage reduction coefficient within predetermined limits, the bias control section selectively coupling the NMOS and PMOS bias voltages associated with the optimal performance value to the first biased section.

2. The IC device of claim 1, wherein the optimal performance value is a candidate performance value having an highest associated leakage reduction coefficient.

3. The IC device of claim 1, wherein the leakage reduction coefficients correspond to measured leakage currents of at least the biasable NMOS transistors.

4. The IC device of claim 1, wherein the leakage reduction coefficients correspond to circuit simulations of a leakage current of at least the NMOS transistors.

5. The IC device of claim 1, wherein the leakage reduction coefficients correspond to measured leakage currents of at least the biasable PMOS transistors.

6. The IC device of claim 1, wherein the leakage reduction coefficients correspond to circuit simulations of a leakage current of at least the PMOS transistors.

7. An integrated circuit (IC) device, comprising:
at least a first biased section comprising a plurality of biasable NMOS transistors and a plurality of biasable PMOS transistors;
at least one bias generation circuit configured to generate a plurality of bias voltages;
a plurality of performance values, each performance value being associated with an NMOS bias voltage and a PMOS bias voltage of the plurality of bias voltages, each performance value corresponding to a speed of the first biased section when the associated NMOS bias voltage is coupled to the biasable NMOS transistors and the associated PMOS bias voltage is coupled to the biasable PMOS transistors;
a plurality of leakage reduction coefficients, each leakage reduction coefficient being associated with an NMOS bias voltage and a PMOS bias voltage of the plurality of bias voltages, each leakage reduction coefficient corresponding to a leakage current reduction of the first biased section when the associated NMOS bias voltage is coupled to the biasable NMOS transistors and the associated PMOS bias voltage is coupled to the biasable PMOS transistors;
at least one bias control section responsive to the plurality of performance values and the plurality of leakage reduction coefficients and adapted to selectively couple an NMOS bias voltage to the NMOS biasable transistors and a PMOS bias voltage to the PMOS biasable transistors, such that the selectively coupled NMOS and PMOS bias voltages provide a first biased section having a predetermined minimum speed and a lowest leakage current corresponding the predetermined minimum speed;
the leakage reduction coefficients comprise a plurality of leakage reduction tables, each leakage reduction table corresponding to a specified process skew factor; and
a skew measurement circuit to measure a die skew factor of the IC; wherein
the bias control section selects a leakage reduction table from the plurality of leakage reduction tables based on the measured die skew factor, the bias control section being responsive to the leakage reduction coefficients of the selected leakage reduction table.

8. The IC device of claim 7, wherein the skew measurement circuit comprises a plurality of skewed ring oscillators.

9. The IC device of claim 7, wherein:
the bias control section is configured to select the leakage reduction table by interpolating between the plurality of leakage reduction tables based on the measured die skew factor.

10. The IC device of claim 7, wherein the leakage reduction table reflects a number of PMOS transistors and a number of NMOS transistors on the IC.

11. The IC device of claim 7, wherein the leakage reduction table reflects a leakage current of stacked NMOS or PMOS transistors.

12. An integrated circuit (IC) device, comprising:
at least a first biased section comprising a plurality of biasable NMOS transistors and a plurality of biasable PMOS transistors;
at least one bias generation circuit configured to generate a plurality of bias voltages;
a plurality of performance values, each performance value being associated with an NMOS bias voltage and a PMOS bias voltage of the plurality of bias voltages, each performance value corresponding to a speed of the first biased section when the associated NMOS bias voltage is coupled to the biasable NMOS transistors and the associated PMOS bias voltage is coupled to the biasable PMOS transistors;
a plurality of leakage reduction coefficients, each leakage reduction coefficient being associated with an NMOS bias voltage and a PMOS bias voltage of the plurality of bias voltages, each leakage reduction coefficient corresponding to a leakage current reduction of the first biased section when the associated NMOS bias voltage is coupled to the biasable NMOS transistors and the associated PMOS bias voltage is coupled to the biasable PMOS transistors; and at least one bias control section responsive to the plurality of performance values and the plurality of leakage reduction coefficients and adapted to selectively couple an NMOS bias voltage to the NMOS biasable transistors and a PMOS bias voltage to the PMOS biasable transistors, such that the selectively coupled NMOS and PMOS bias voltages provide a first biased section having a predetermined minimum speed and a lowest leakage current corresponding the predetermined minimum speed, the bias control section comprising at least one emulation circuit that emulates a speed of the first biased section, the emulation circuit receiving the plurality of bias voltages and generating the plurality of performance values, each generated performance value corresponding to a NMOS bias voltage and a PMOS bias voltage selected from the plurality of bias voltages.

13. The IC device of claim 12, wherein the emulation circuit further comprises:

a plurality of ring oscillators, each comprising a plurality of stages connected in a ring, at least one of the stages including the biasable transistors, each biasable transistor being selectively coupled to a bias voltage selected from the plurality of bias voltages; and at least one counter circuit coupled to the ring oscillators, the counter circuit generating a count value for each ring oscillator based on a frequency of the ring oscillator.

14. The IC device of claim 13, wherein:

the at least one emulation circuit further comprises a counter multiplexer (MUX) that selectively connects one of the plurality of ring oscillators to the at least one counter circuit.

15. The IC device of claim 13, wherein:

the at least one emulation circuit further comprises a counter demultiplexer (deMUX) that selectively connects the at least one counter circuit to a plurality of registers configured to store count values from the at least one counter circuit.

16. A method comprising:

receiving a plurality of performance values, each performance value being associated with an NMOS bias voltage and a PMOS bias voltage of a plurality of bias voltages, each performance value corresponding to a speed of a first biased section when the associated NMOS bias voltage is coupled to biasable NMOS transistors of the first biased section and the associated PMOS bias voltage is couples to biasable PMOS transistors of the first biased section;

receiving a plurality of leakage reduction coefficients, each leakage reduction coefficient being associated with an NMOS bias voltage and a PMOS bias voltage of the plurality of bias voltages, each leakage reduction coefficient corresponding to a leakage current of the first biased section when the associated NMOS bias voltage is coupled to biasable NMOS transistors of the first biased section and the associated PMOS bias voltage is couples to biasable PMOS transistors of the first biased section; and selecting an NMOS bias voltage and a PMOS bias voltage to be coupled to the first biased section, such that the performance value and leakage reduction coefficient associated with the selected NMOS and PMOS bias voltage correspond to the first biased section having a predetermined minimum speed and a lowest leakage current corresponding to the predetermined minimum speed.

17. The method of claim 16, wherein selecting the NMOS bias voltage and the PMOS bias voltage to be coupled to the first biased section further comprises:

determining a plurality of candidate performance values that correspond to the first biased section having the predetermined speed;

determining an optimal performance value from the plurality of candidate performance values such that the optimal performance value has a maximum leakage reduction coefficient; and selecting the NMOS bias voltage and the PMOS bias voltage associated with the optimal performance value as the NMOS and PMOS bias voltages to be coupled to the first biased section.

18. The method of claim 16, wherein selecting the NMOS bias voltage and the PMOS bias voltage to be coupled to the first biased section further comprises:

setting a current NMOS bias voltage to zero volts and setting a current PMOS bias voltage to a maximum bias voltage of the plurality of bias voltages;

determining a current performance value as the performance value associated with the current NMOS bias voltage and the current PMOS bias voltage;

reducing the PMOS bias voltage until the current performance value corresponds to the first biased section having the predetermined speed, if the current value associated with the current NMOS and current PMOS bias voltages does not correspond to the first bias section having the predetermined minimum speed;

determining a first leakage reduction coefficient as the leakage reduction coefficient associated with the current NMOS and the current PMOS bias voltages;

determining a second leakage reduction coefficient that is associated with a higher NMOS bias voltage, if the NMOS bias voltage is less than the maximum bias voltage of the plurality of bias voltages;

selecting the current NMOS bias voltage and the current PMOS bias voltage as the NMOS and PMOS bias voltage to be coupled to the first biased section, if the second leakage reduction coefficient is less than the first leakage reduction coefficient; and repeating the steps of determining the current performance value, reducing the PMOS bias voltage, determining the first leakage reduction coefficient, and determining the second leakage reduction coefficient until either the current NMOS bias voltage is set to the maximum bias voltage of the plurality of bias voltages or the second leakage reduction coefficient is less than the first leakage reduction coefficient.

19. The method of claim 16, wherein receiving the plurality of leakage reduction coefficients further comprises:

measuring leakage currents of at least the biasable NMOS transistors; and receiving leakage reduction coefficients corresponding to the measured leakage currents.

20. The method of claim 16, wherein receiving the plurality of leakage reduction coefficients further comprises:

performing simulations to obtain simulated leakage currents of at least the biasable NMOS transistors; and receiving leakage reduction coefficients corresponding to the simulated leakage currents.

21. The method of claim 16, wherein receiving the plurality of leakage reduction coefficients further comprises:

measuring leakage currents of at least the biasable PMOS transistors; and receiving leakage reduction coefficients corresponding to the measured leakage currents.

22. The method of claim 16, wherein receiving the plurality of leakage reduction coefficients further comprises:

performing simulations to obtain simulated leakage currents of at least the biasable PMOS transistors; and receiving leakage reduction coefficients corresponding to the simulated leakage currents.

23. The method of claim 16, wherein receiving the plurality of leakage reduction coefficients further comprises:

receiving a plurality of leakage reduction tables, each leakage reduction table corresponding to a specified process skew factor;

measuring a die skew factor of the integrated circuit using a skew measurement circuit;

selecting a leakage reduction table of the plurality of leakage reduction tables based on the measured die skew factor; and receiving the leakage reduction coefficients of the selected leakage reduction table.

24. The method of claim 23, wherein measuring the die skew factor further comprises measuring the die skew factor using a plurality of skewed ring oscillators.

25. The method of claim 23, wherein selecting the leakage reduction table further comprises interpolating between the plurality of leakage reduction tables based on the measured die skew factor.

26. The method of claim 23, wherein the leakage reduction coefficients reflect the number of PMOS transistors and the number of NMOS transistors on the IC.

27. The method of claim 23, wherein the leakage reduction coefficients reflect a leakage current of stacked NMOS or PMOS transistors.

28. The method of claim 16, wherein receiving the plurality of performance values further comprises:

coupling the plurality of body bias voltages to emulation circuits on an IC, the emulation circuits having structures corresponding to operational circuits on the IC; and receiving a plurality of performance values obtained from evaluating performance of the emulation circuits under the plurality of body bias voltages coupled to the emulation circuits.

29. The method of claim 28, wherein:

coupling the plurality of body bias voltages to the emulation circuits comprises applying the plurality of body bias voltages to ring oscillator circuits that are included in the emulation circuits of the IC: and evaluating performance of the emulation circuits comprises generating count values based on a frequency of the ring oscillator circuits.

* * * * *